United States Patent
Floyd et al.

(10) Patent No.: US 7,199,658 B2
(45) Date of Patent: Apr. 3, 2007

(54) CIRCUITS AND METHODS FOR IMPLEMENTING POWER AMPLIFIERS FOR MILLIMETER WAVE APPLICATIONS

(75) Inventors: Brian A. Floyd, Cortlandt Manor, NY (US); Alberto Valdes Garcia, College Station, TX (US); Ullrich R. Pfeiffer, Yorktown Heights, NY (US); Scott Kevin Reynolds, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 11/131,534

(22) Filed: May 18, 2005

(65) Prior Publication Data

US 2006/0261890 A1 Nov. 23, 2006

(51) Int. Cl.
*H03F 3/217* (2006.01)
(52) U.S. Cl. .................................... 330/251; 330/302
(58) Field of Classification Search ................. 330/251, 330/302
See application file for complete search history.

(56) References Cited

U.S. PATENT DOCUMENTS

| | | | |
|---|---|---|---|
| 3,919,656 A * | 11/1975 | Sokal et al. ................... | 330/51 |
| 5,341,109 A * | 8/1994 | Ryat ............................ | 330/288 |
| 6,388,512 B1 * | 5/2002 | Sims, III ....................... | 330/2 |
| 6,771,128 B1 * | 8/2004 | Yamashita et al. .......... | 330/285 |
| 7,023,279 B2 * | 4/2006 | Grasset et al. .............. | 330/302 |
| 2004/0008082 A1 * | 1/2004 | Dow ............................ | 330/51 |

* cited by examiner

*Primary Examiner*—Patricia Nguyen
(74) *Attorney, Agent, or Firm*—F. Chau & Associates LLC; Frank V. DeRosa

(57) ABSTRACT

Circuits and methods are provided for implementing highly efficient switch-mode power amplifiers using BJTs (bipolar junction transistors) as active switching devices at millimeter-wave frequencies. More specifically, circuits and methods are provided for driving power amplifiers with BJT switching devices to achieve highly efficient switch-mode (e.g., Class E) operation at millimeter wave frequencies (e.g., 60 GHz).

29 Claims, 19 Drawing Sheets

CIRCUITS AND METHODS FOR IMPLEMENTING POWER AMPLIFIERS FOR MILLIMETER WAVE APPLICATIONS

TECHNICAL FIELD OF THE INVENTION

The present invention relates generally to circuits and methods for implementing power amplifiers for millimeter wave applications. More specifically, the invention relates to circuits and methods for implementing highly efficient RF (radio frequency) switch-mode power amplifiers using bipolar junction transistors as active switching devices at millimeter-wave frequencies.

BACKGROUND

In general, RF power amplifiers are designed according to one of various classes commonly designated as class A, B, C, D, and F, or hybrids thereof (e.g., class A/B, Class E/F, etc.). These different classes of power amplifiers differ with respect to method of operation (linear mode, switched mode), efficiency, output impedance and power output capability. For applications in which highly efficient power amplifier designs are required, switched mode Class D, E or F power amplifiers are typically implemented, as opposed to linear mode class A, B or AB power amplifier designs. Indeed, with switched-mode power amplifier designs, high efficiency is obtained by operating the active device(s) as a switch rather than a controlled current source, wherein various tuning methods can be implemented to minimize or eliminate overlap between the voltage and current waveforms across the switching devices to thereby reducing power dissipation (referred to as "zero voltage switching"). High efficiency power amplifiers are typically used in applications such as power supply converter and power supply regulator circuits, for example, where zero voltage switching is needed to reduce power consumption.

For high-efficiency switched-mode power amplifiers, the highest achievable frequency of operation is limited by various factors such as the type of switching devices implemented, for example. Power amplifiers providing Class E operation at high frequencies typically use MESFET, HEMT, or MOSFET switching devices. For example, Class E amplifiers operating at 10 GHz are known to use GaAs MESFET switching devices, but Class E amplifiers frequencies greater than 10 GHz are not known to exist. Indeed, Class E amplifiers using bipolar transistors, for example, are generally restricted to lower operating frequencies and bipolar power amplifiers operating at millimeter wave frequencies are typically designed using Class A or Class A/B operating modes.

SUMMARY OF THE INVENTION

Exemplary embodiments of the invention generally include circuits and methods for implementing highly efficient switch-mode power amplifiers using BJTs (bipolar junction transistors) as active switching devices at millimeter-wave frequencies. More specifically, exemplary embodiments of the invention include circuits and methods for driving power amplifiers with BJT switching devices to achieve highly efficient switch-mode (e.g., Class E) operation at millimeter wave frequencies (e.g., 60 GHz).

In one exemplary embodiment of the invention, a power amplifier circuit includes an active switch device comprising a BJT (bipolar junction transistor), and an input network coupled to a base of the BJT to drive the active switch for a switch-mode operation. The input network, which may comprise a passive or active driver network, is designed to provide optimal driving conditions according to exemplary embodiments of the invention.

For instance, in one exemplary embodiment, the input network is designed to present a real input impedance in a range of about 7 Ohms to about 15 Ohms as seen from the base of the active switch device. In another exemplary embodiment, an optimal driving condition includes the input network being designed to provide an asymmetrical drive current to the base of the active switch device, wherein the negative peak base current exceeds the positive peak base current.

In yet another exemplary embodiment, an optimal driving condition comprises the input network being designed to provide such asymmetrical drive base current to the active switch device such that the base voltage has a swing that does not exceed about 400 mVpp (millivolts peak-to-peak). The asymmetrical base current has a negative peak voltage amplitude that is greater than a positive peak voltage amplitude.

Exemplary amplifier designs according to the invention, provide power amplifiers that can operate with a fundamental frequency of about 10 GHz or more, while providing an output power of +10 dBm or greater with a power added efficiency of 15% or greater.

These and other exemplary embodiments, features and advantages of the present invention will be described or become apparent from the following detailed description of exemplary embodiments, which is to be read in connection with the accompanying drawings.

DETAILED DESCRIPTION OF EXEMPLARY EMBODIMENTS

Exemplary embodiments of the invention as described in detail hereafter generally include circuits and methods for implementing highly efficient switch-mode power amplifiers using BJT active switching devices at millimeter-wave frequencies and, in particular, circuits and methods for driving power amplifiers with BJT switching devices to achieve highly efficient switch-mode (e.g., Class E) operation at millimeter wave frequencies (e.g., 60 GHz). For illustrative purposes, the following description of exemplary architectures, simulations, and circuit designs will be made with specific reference to Class E power amplifiers based on silicon-germanium (SiGe) bipolar process technologies, which enable highly efficient operation at millimeter wave frequencies such as 60 GHz. It is to be appreciated, however, that the inventive principles described herein apply generally to all classes of switched-mode power amplifier designs in which BJTs are used as switches and operated close to their maximum frequency of operation, i.e., at a frequency of approximately 10% or more of $f_T$ or $f_{MAX}$. This includes amplifiers designed using BJTs fabricated in other process technologies, including those based on III–V semiconductor materials, such as GaAs and InP.

It is to be appreciated that switched-mode power amplifier designs according to the invention can be used for building highly integrated, low cost, millimeter wave radio transceivers in silicon, for use in portable devices for wireless local-area network (WLANS) applications, for example. Indeed, for such applications, strict requirements for battery operation of portable devices has resulted in strong need for highly-efficient power amplifiers, while cost constraints have precluded the use of external components or III–V semiconductor materials. Existing millimeter wave power amplifier designs using class A or AB operation with SiGe BJTs have achieved power-added efficiencies (PAEs) of 3–10% for output powers in the range of +10 dBm.

It is to be appreciated, however, that exemplary circuits and methods described hereafter provide switched-mode SiGe BJT power amplifiers with even higher efficiency. For example, circuits and methods according to exemplary embodiments of the invention are provided for constructing two-stage, single-ended and/or differential Class E power amplifiers with output powers of +10 dBm or greater and PAEs of 15% or greater. These exemplary designs can be fabricated using the BiCMOS8HP processing technologies of IBM (International Business Machines) Corporation.

Figure 1:
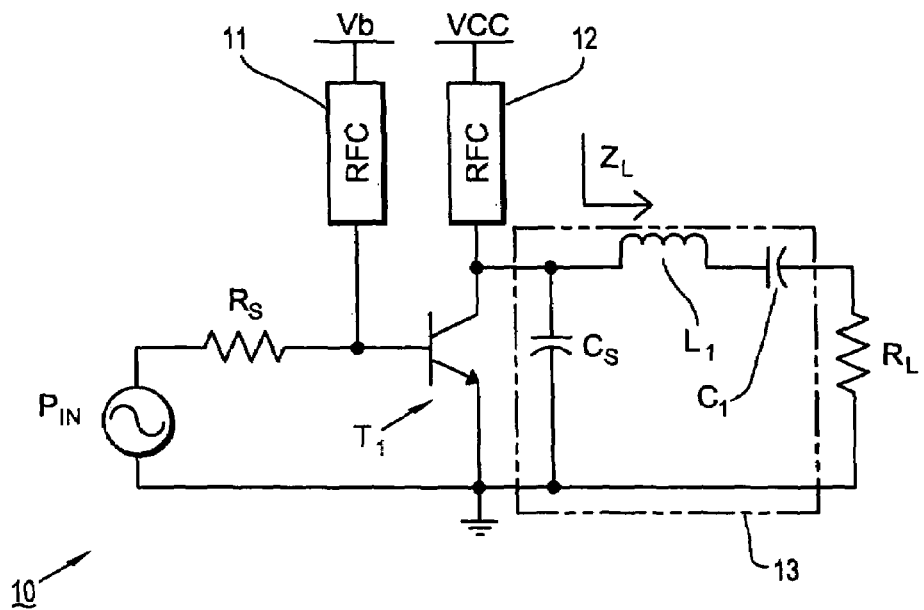
FIG. 1 schematically illustrates a general architecture of a Class E power amplifier which can be designed using exemplary circuits and methods of the present invention to provide highly-efficient switched mode operation at millimeter wave frequencies.

Referring now to FIG. 1, a schematic circuit diagram illustrates a general architecture of a Class E power amplifier (10) which can be designed using exemplary circuits and methods of the present invention to provide highly-efficient switched mode operation at millimeter wave frequencies. The power amplifier (10) comprises an active switch device T1, which is implemented as a BJT (bipolar junction transistor). A base terminal of the transistor T1 is connected to a base DC bias voltage $V_b$ through RF choke (11), and a collector terminal of the transistor T1 is connected to VCC power supply through RF choke (12). An input signal $P_{IN}$ is applied to the base terminal of T1 through an impedance $R_S$ (which denotes the impedance seen from the base of transistor T1 looking to the power source) An output matching network (13), which comprises shunt capacitor $C_S$, series inductor $L_1$ and series capacitor $C_1$, is connected between the collector terminal of the transistor T1 and a load RL The series tuned $L_1C_1$ circuit is designed to block DC signals and harmonic frequencies of the fundamental operating frequency of $P_{IN}$.

Figure 2:
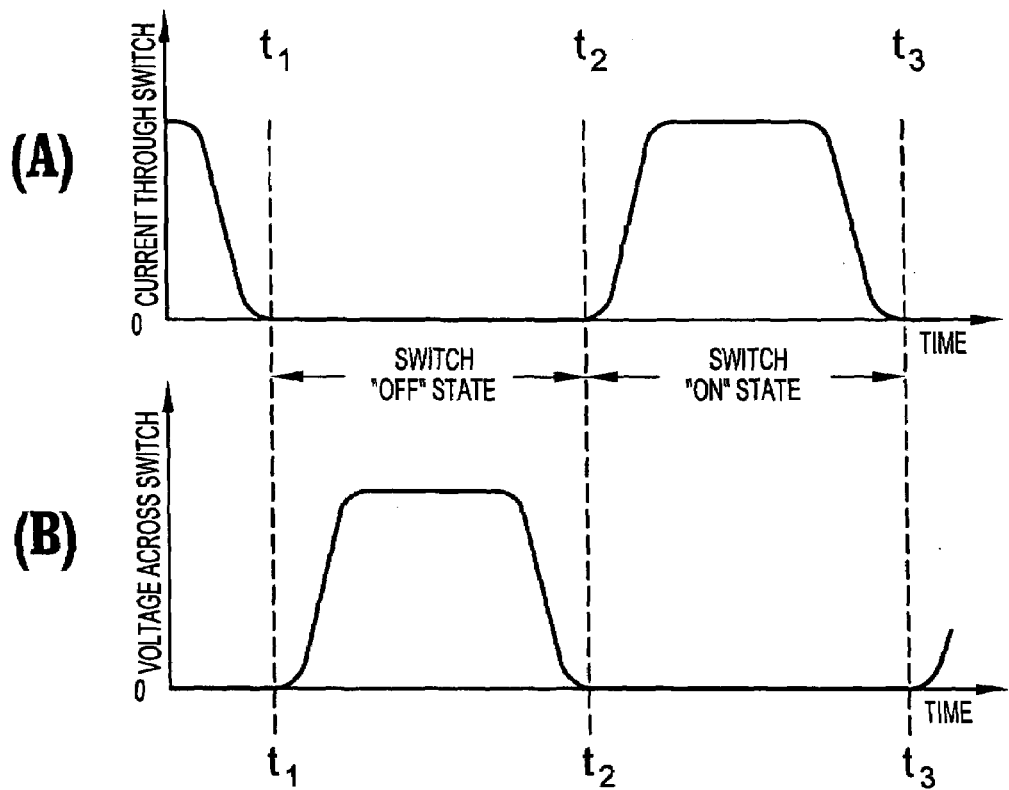
FIGS. 2A and 2B are exemplary timing diagrams illustrating optimal current and voltage waveforms, respectively, of the Class E power amplifier of FIG. 1 to provide zero voltage switching.

In general, the Class E power amplifier (10) is designed such that the transistor T1 acts as a switch and the output matching network (13) is designed to optimize the performance by minimizing overlap between the voltage and current signals across the switch T1. More specifically, by way of example, FIGS. 2A and 2B are timing diagrams that illustrate collector voltage and current waveforms of the transistor T1 of FIG. 1 under ideal conditions where the collector efficiency is 100%. In particular, during period t1~t2, the transistor T1 is in an "OFF" state, wherein the current through the transistor T1 (FIG. 2A) is 0 when the collector voltage is high (FIG. 2B). During this period, the transistor T1 operates as an open switch. Then, during period t2~t3, the transistor T1 is in an "ON" state, where the collector voltage is low (nearly zero) (FIG. 2B) and high current (FIG. 2A) is flowing through the switch T1. During this period, the transistor operates as a low resistance closed switch. Under these ideal conditions, the VI product (instantaneous power dissipation by the switch T1) is minimized through the entire period of the input power.

In a practical power amplifier circuit with a real transistor, however, there are several sources of power loss and other practical considerations that must be taken into consideration to realize optimal switching transitions. For instance, one source of power loss is the transistor saturation voltage, $V_{sat}$, which is the minimum collector voltage that can actually be attained during the collector voltage downward swing. Indeed, a non-zero $V_{sat}$ while current is flowing through the transistor T1 results in power being dissipated in the transistor T1.

Moreover, the transistor "ON" state resistance and the ON-to-OFF transition time are other significant sources of power loss. For instance, a non-zero ON-to-OFF transition time, or "turn-off" time, $t_f$, will cause the collector voltage and current waveforms to overlap, resulting in transistor power dissipation.

At millimeter-wave frequencies, when the transistor T1 is operated above 10% of the $f_T$ (maximum frequency of operation), the turn-off time $t_f$ and the interaction of $t_f$ with $V_{sat}$ are particularly important. If the transistor T1 is turned on hard and driven deeply into saturation, $V_{sat}$ is minimized, but the turn-off time is increased. The collector efficiency, $\eta$, as a function of the turn-off time of the switch is specified as:

$$\eta = \frac{1}{1 + \frac{1}{3}(\pi \cdot t_f / T)^2}, \quad (1)$$

where T is the period of the fundamental frequency.

Figure 3:
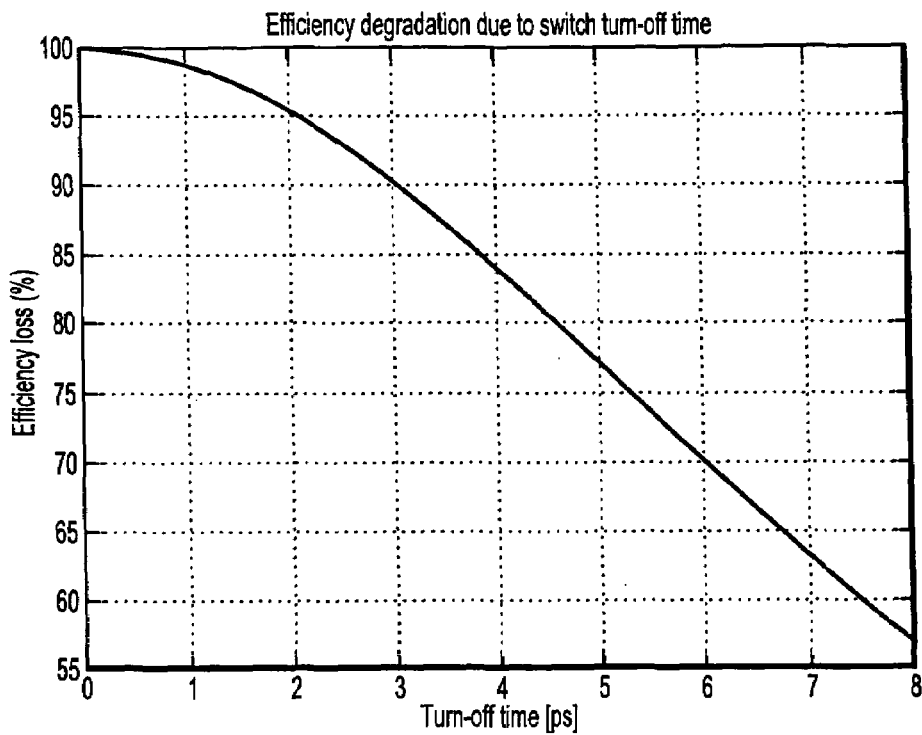
FIG. 3 is an exemplary graphical illustration of collector efficiency as a function of transistor turn-off time for a Class E power amplifier.

FIG. 3 is an exemplary graphical diagram illustrating the collector efficiency $\eta$ as a function of turn-off time (in picoseconds) for a frequency (1/T) of 60 GHz based on equation (1) above. As shown in FIG. 3, the collector efficiency will significantly degrade with an increased turn-off time. To optimize the collector efficiency, it is necessary to reach some compromise between minimizing $V_{sat}$ and minimizing turn-off time, both of which will contribute to power loss in the collector circuit.

Another potential source of power dissipation, and thus degradation of efficiency, is the power consumed in the preamplifier (or driver circuits) that is implemented for driving the switch device T1. The PAE as a function of the power dissipated in the switch ($P_{DC}$) and the preamplifier ($P_{DR}$) can be expressed as:

$$PAE = \frac{P_{OUT} - P_{IN}}{P_{DC} - R_{DR}}. \quad (2)$$

Figure 4:
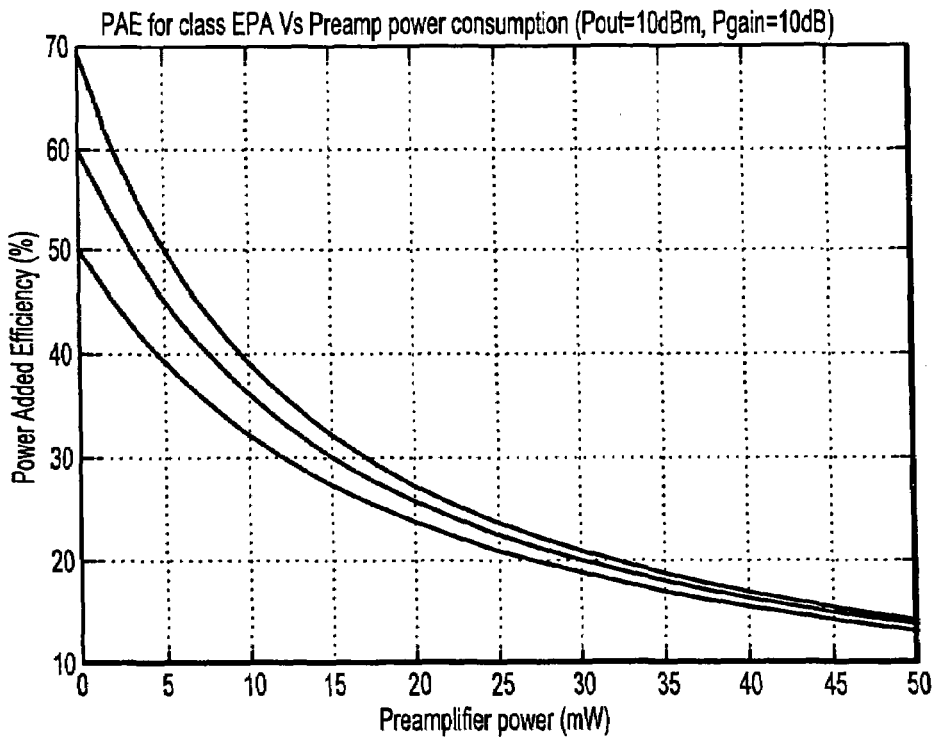
FIG. 4 is an exemplary graphical illustration of power added efficiency (PAE) of a Class E power amplifier as a function of preamplifier (driver) power consumption for three different values of efficiency in the amplifier core (70% to 50%), assuming an output power of +10 dBm, and a total (driver plus Class E core) power gain of 10 dB.

By way of example, FIG. 4 is a diagram that graphically illustrates PAE as a function of preamplifier (driver) power consumption assuming an output power of 10 dBm and a total power gain of 10 dB (driver plus class E core) for 3 different values of the efficiency in the amplifier core (70%, 60% and 50%), based on the above equation (2). As shown in FIG. 4, the PAE efficiency significantly degrades with increased preamplifier power.

In view of the above, exemplary embodiments of the invention include circuits and methods for driving the active switching device T1 so as to maintain T1 in an "ON" state for a period of time that minimize the combined power loss due to non-zero $V_{sat}$ and non-zero turn-off time, and driving the switch voltage to zero (turning the transistor "OFF") in a manner that minimizes the power dissipation of the transistor T1. For a single-ended Class E amplifier (as shown in FIG. 1) which is implemented using IBM's BiCMOS8HP SiGe technology, and designed for an output power of +10 dBm, various optimal driving conditions have been determined for achieving highly efficient, Class E operation for bipolar power amplifiers at millimeter wave frequencies.

More specifically, in one exemplary embodiment of the invention, an input network (passive impedance transformer or active driver circuit) is designed to present a real input impedance in a range of about 7 Ohms to about 15 Ohms as seen from the base of the active switch T1 (which is depicted as $R_S$ in FIG. 1). In another exemplary embodiment, an optimal driving condition includes the input network being designed to provide an asymmetrical drive current to the base of the active switch T1, wherein the negative peak base current exceeds the positive peak base current. In yet another exemplary embodiment, an optimal driving condition comprises the input network being designed to provide such asymmetrical drive base current to the transistor T1 without forcing a base voltage swing exceeding about 400 mVpp (millivolts peak-to-peak).

In other exemplary embodiments, the exemplary source impedance will scale with increased power designs. In particular, when a power amplifier is scaled to higher power outputs, the switching transistor T1 will increase in size and the required base current drive will increase. To provide the higher required base current without forcing a base voltage swing greater than 400 mVpp, the optimum source impedance will be reduced (i.e., the source impedance will scale proportionally with Ohm's law.). In this manner, the optimal source impedance will scale with the power output of the Class E power amplifier.

Various computer simulations were performed to confirm exemplary optimum driving conditions as described above. For instance, computer simulations were performed on the Class E amplifier circuit of FIG. 1, for a frequency of 60 GHz, wherein the source impedance $R_S$ was set to 10 Ohms and 30 Ohms, Cs was determined according to known idealized design equations to have a value of approximately 50 pF, and output matching components $L_1$ and $C_1$ were adjusted such that output load $Z_L$ seen by the transistor T1 was 10 Ohms. The results of such simulations are depicted in FIGS. 5A~5D and 6A~6B.

Figure 5A:
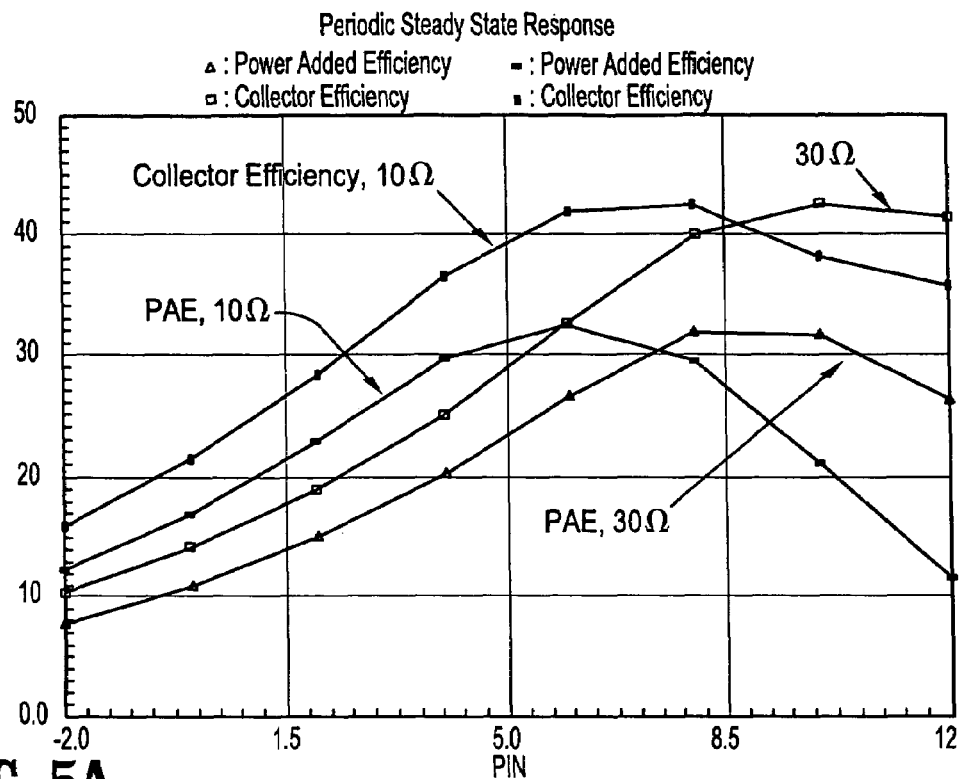
FIGS. 5A–5D are exemplary graphical illustrations of simulation results of transducer gain and collector efficiency as a function of source power levels for a Class E amplifier having different source impedances (Zs) of 10 Ohms and 30 Ohms.
Figure 5B:
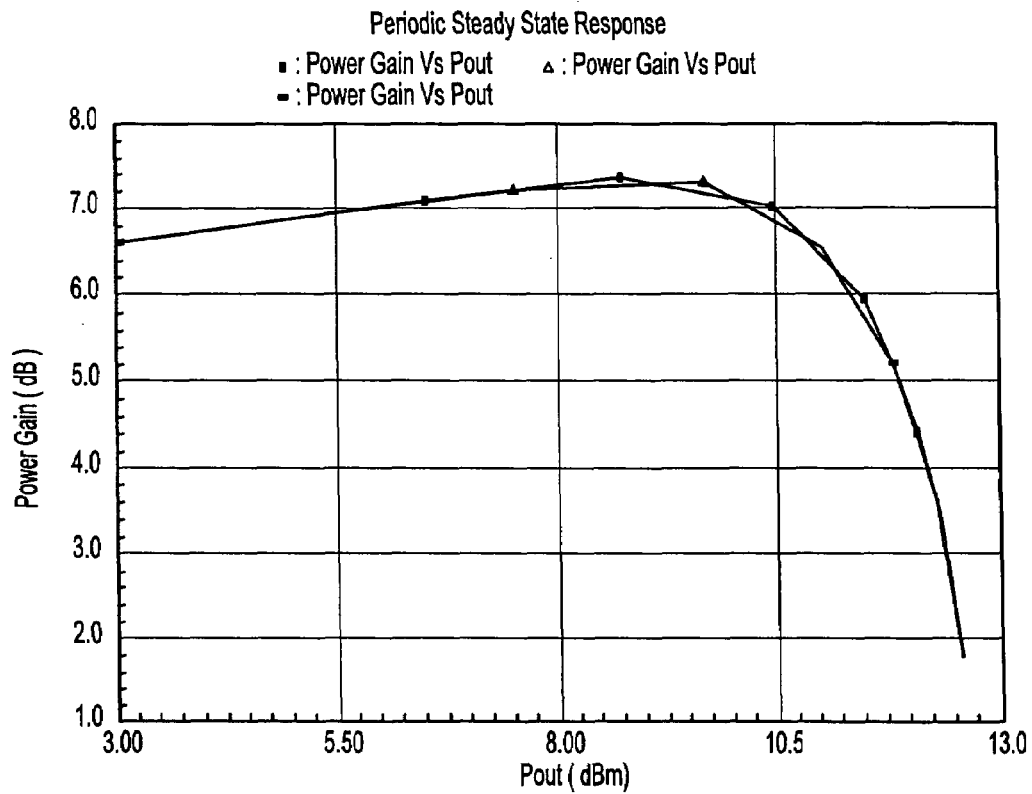
Figure 5C:
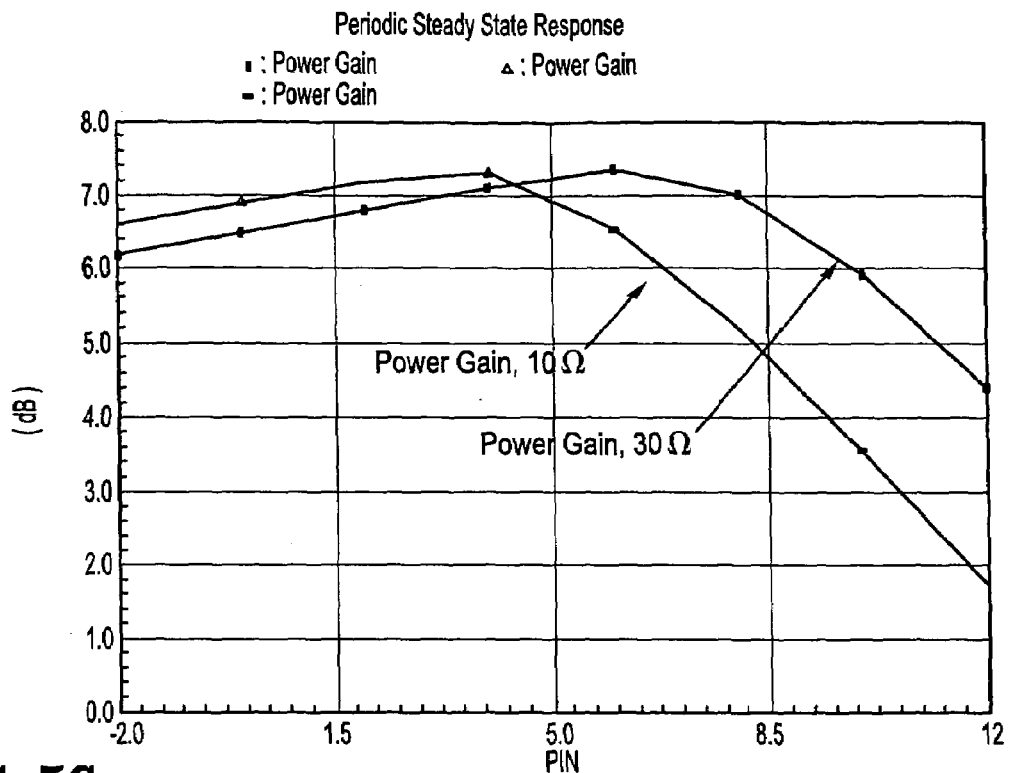
Figure 5D:
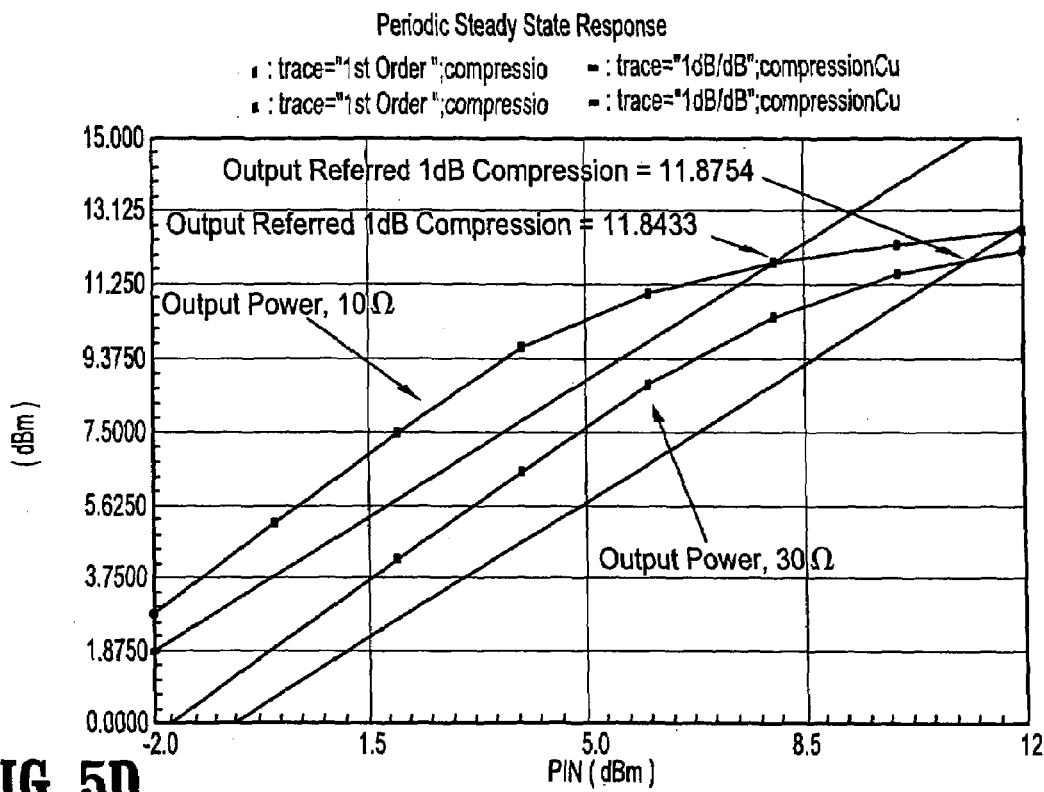

FIGS. 5A~5D depict exemplary graphical illustrations of simulation results of transducer gain and collector efficiency as a function of source power levels for a Class E amplifier having different source impedances (Zs) of 10 Ohms and 30 Ohms. In particular, FIG. 5A graphically illustrates simulated collector efficiency and power added efficiency (PAE) versus the source power level setting for Zs of 10 and 30 Ohms. FIG. 5B graphically illustrates power gain versus output power level for Zs of 10 and 30 Ohms. FIG. 5C graphically illustrates power gain versus the source power level setting for Zs of 10 and 30 Ohms. FIG. 5D graphically illustrates power output versus the source power level setting for Zs of 10 and 30 Ohms. The straight lines in FIG. 5D are the extrapolated small signal gain, and the where the simulated gain crosses the straight lines represents the output-referred 1-dB compression point.

Collectively, FIGS. 5A~5D show that for the higher source impedance Rs of 30 Ohms, higher input power levels are needed to achieve the same power transducer gain and collector efficiency. Thus, the lower source impedance of 10 Ohms provides superior PAE when the power consumed by the preceding driver stage is taken into account. Indeed, in FIGS. 5A~5D, it can be seen that the peak efficiency and power gain occurs at a lower source power level when the source impedance is 10 Ohms.

The PAE plotted in FIG. 5A is based only on the power from the source ($P_{IN}$), but not the power consumption in the driver circuit, since the driver circuit was not simulated. Achieving peak efficiency and power gain at lower input powers is advantageous, since it will result in lower power consumption in the driver stage and therefore provide a better overall PAE.

Figure 6A:
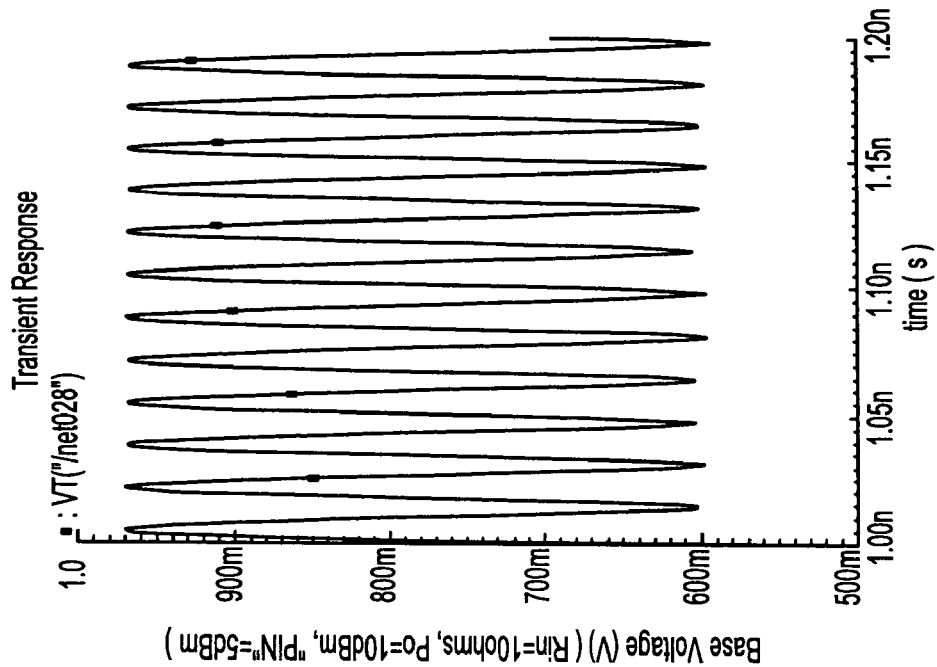
FIGS. 6A and 6B are exemplary graphical illustrations of simulated base voltages of a Class E amplifier having a source impedance of 30 Ohms and 10 Ohms, respectively.
Figure 6B:
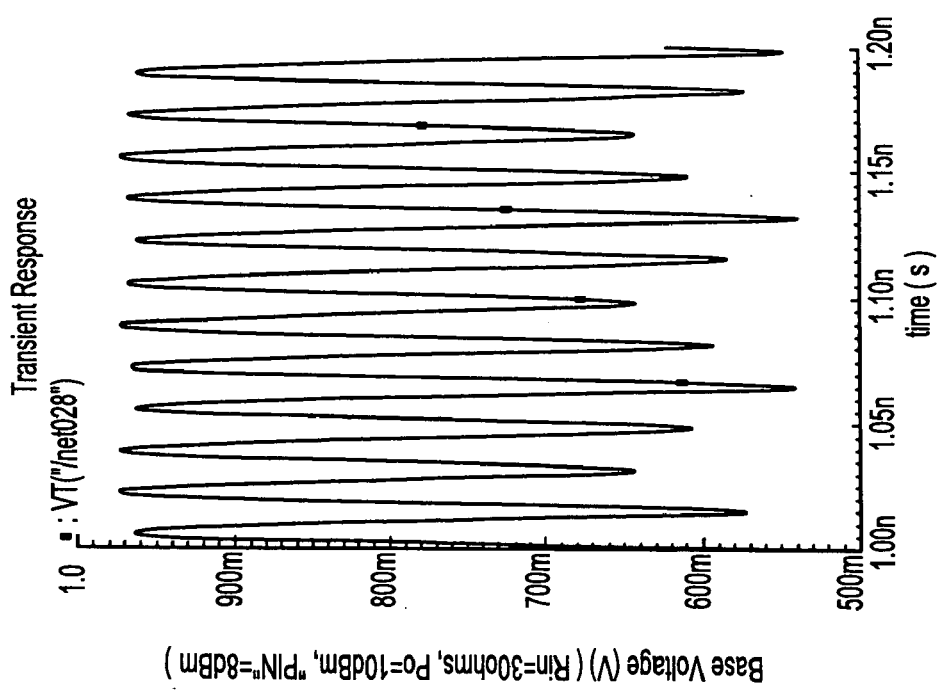

Furthermore, FIGS. 6A and 6B are diagrams that illustrate simulated base voltage waveforms that were obtained for source impedances RS of 30 Ohms and 10 Ohms, respectively. In FIG. 6A, for a source impedance of 30 Ohms, a base voltage waveform obtained has cycle-to-cycle amplitude variations, which indicate that the transistor T1 is not being completely turned off every cycle. As depicted in FIG. 6B, the lower source impedance RS of 10 Ohms results in a base voltage waveform with constant amplitude variation, which confirms an exemplary driving condition of the invention that a low source impedance enables complete discharge of the minority carrier charge in the base of T1 which ensures stable switching behavior.

Figure 7:
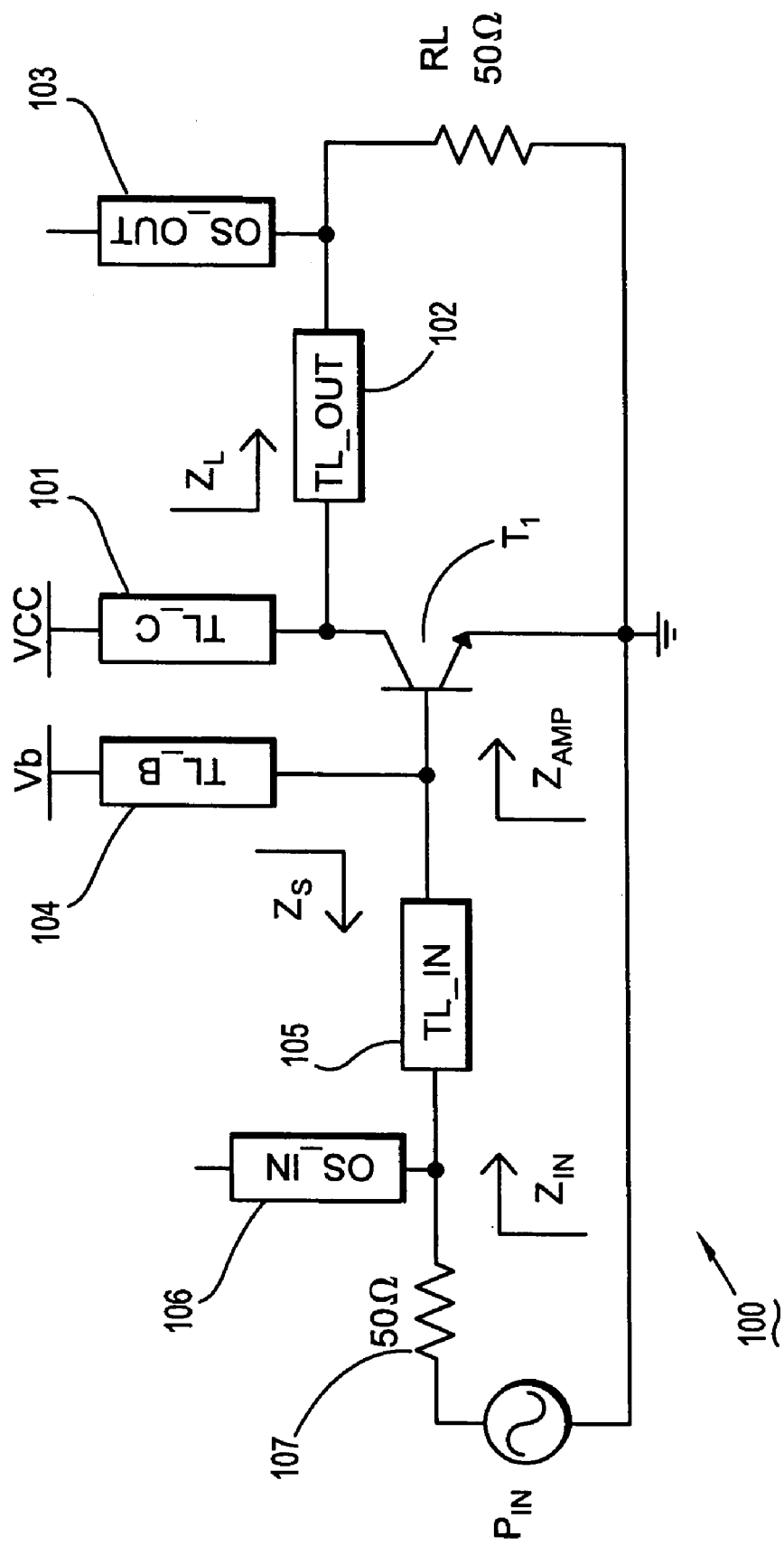
FIG. 7 is a schematic circuit diagram of a Class E amplifier circuit comprising on-chip transmission line input and output matching networks, according to an exemplary embodiment of the invention.

FIG. 7 is a schematic circuit diagram of a Class E amplifier (100) comprising on-chip transmission line input and output matching networks, according to an exemplary embodiment of the invention. The Class E amplifier (100) is similar to that of FIG. 1, except that the series output inductor $L_1$, RF choke (12) and shunt capacitor $C_S$ in FIG. 1 are replaced by practical output impedance transformation components formed by on-chip transmission lines, TL_C (101), TL_OUT (102), and OS_OUT (103), respectively. The transmission line TL_C (101) is designed to have a high impedance at the operating frequency (e.g.,60 GHz) and takes the place of the RF choke (12). The transmission line TL_OUT (102) is an electrically short length of transmission line and OS_OUT (103) is an open-stub transmission line. This combination of transmission lines transforms the load impedance (e.g., RL=50 Ohms) to the optimum impedance to be seen from the collector of T1 (e.g. ZL) for class E operation at the frequency of interest (e.g. 60 GHz)

Furthermore, the power amplifier (100) comprises an on-chip transmission line TL_B (104), which serves as a base RF choke (11), and an on-chip transmission lines TL_IN (105) and OS_IN (106), which perform input impedance matching. The 50 Ohm resistor (107) represents a typical on chip microstrip transmission line with a 50 Ohm characteristic impedance.

Various simulations were performed using the exemplary circuit of FIG. 7 to compare several input impedance matching techniques. In one technique, the input transmission line TL_IN (105) and open stub OS_IN (106) were sized to provide a real source impedance Zs of about 7 Ohms to about 10 Ohms, as seen from the base of transistor T1 towards the power source PIN.

Figure 8A:
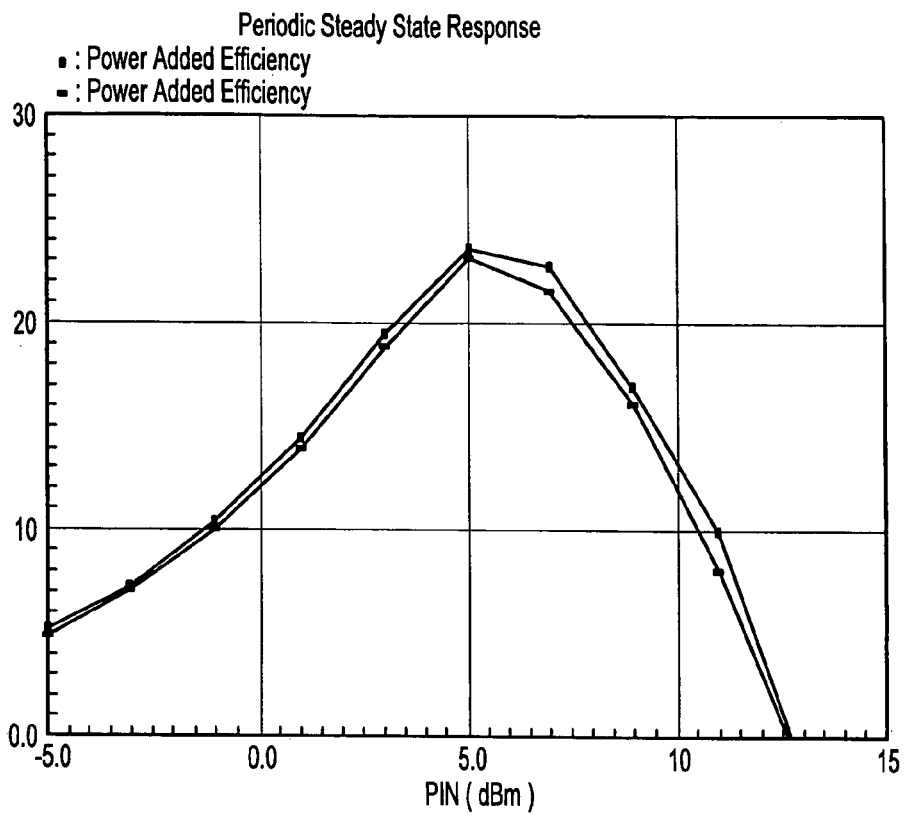
FIGS. 8A–8D are exemplary graphical illustrations of simulation results for the circuit in FIG. 7, wherein the input matching network is designed such that a low real impedance (about 7 Ohms to about 10 Ohms) is seen form the base toward the source (shown as $Z_S$ in FIG. 7).
Figure 8B:
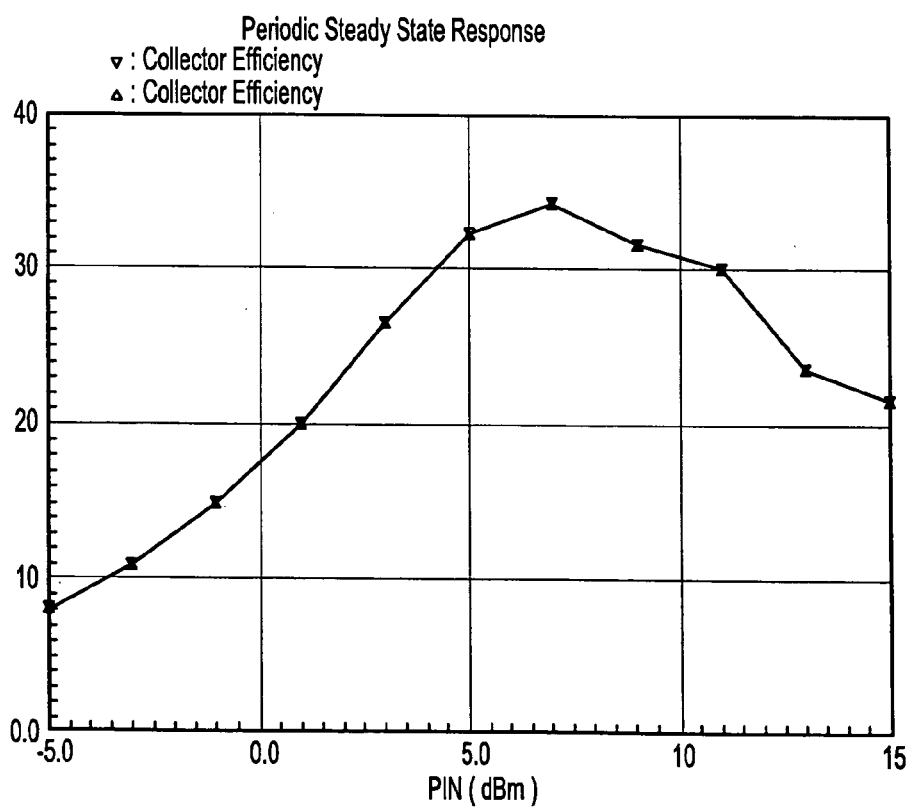
Figure 8C:
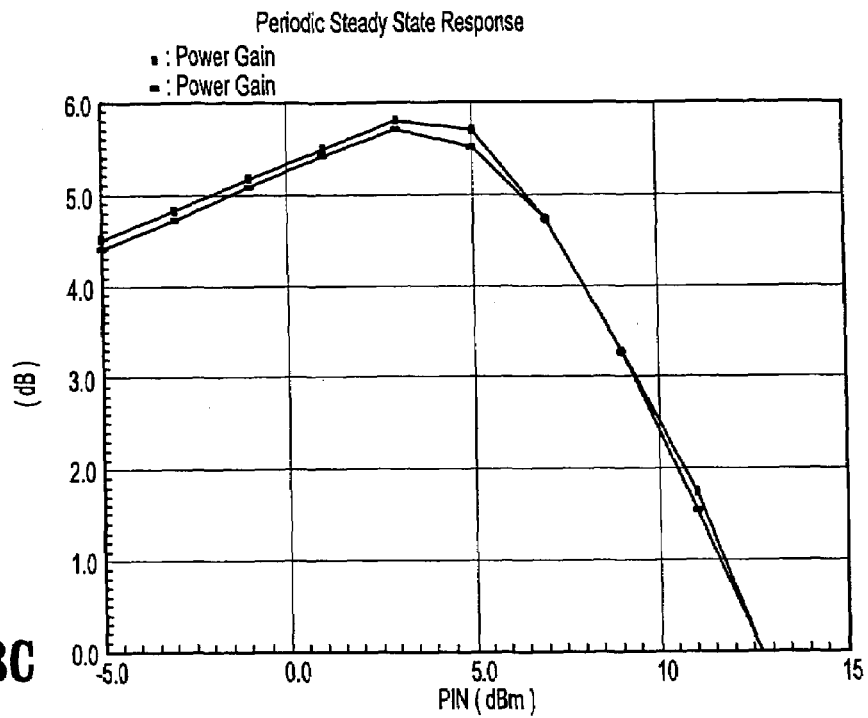
Figure 8D:
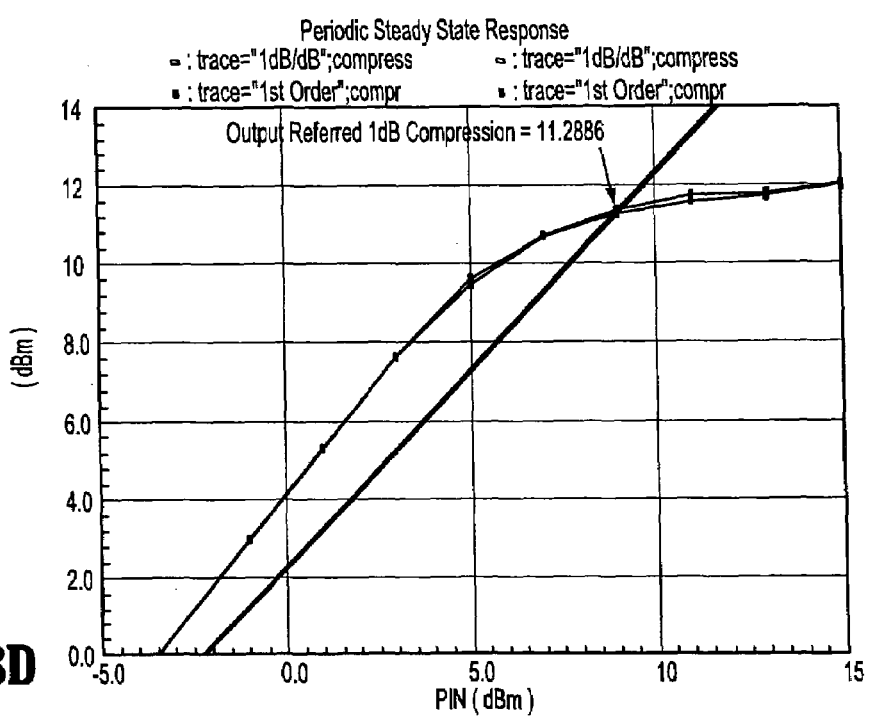
Figure 9A:
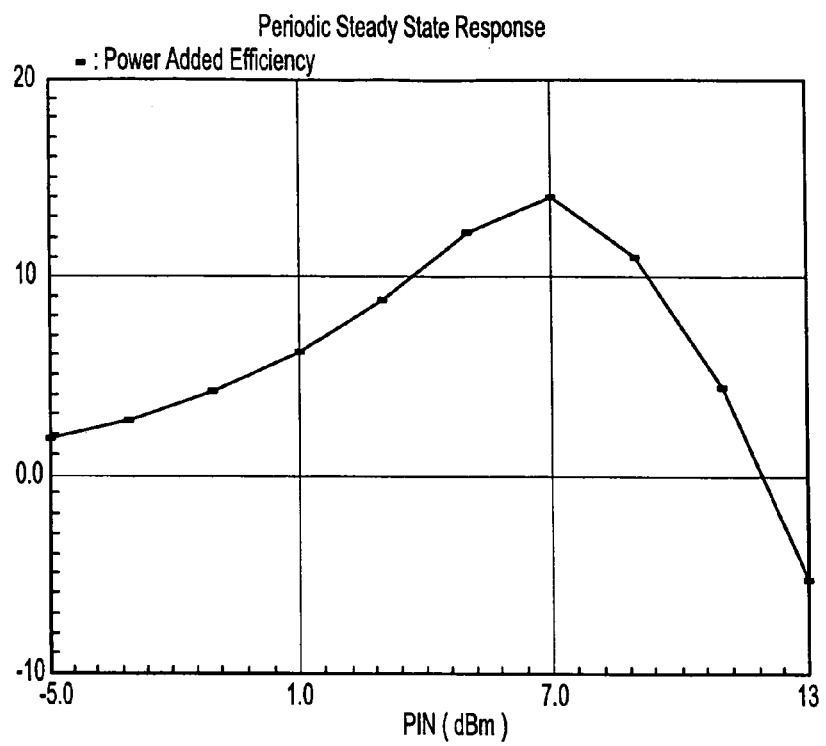
FIGS. 9A~9D are exemplary graphical illustrations of simulation results for the circuit in FIG. 7, wherein the input matching network is designed to provide conjugate matching between the power source and the switch device (e.g., transistor base).
Figure 9B:
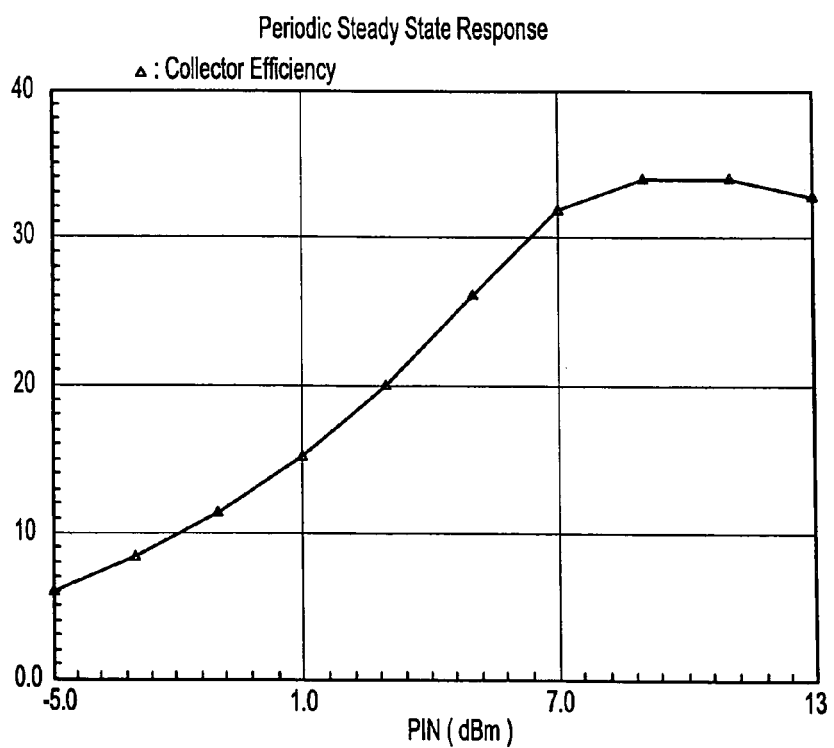
Figure 9C:
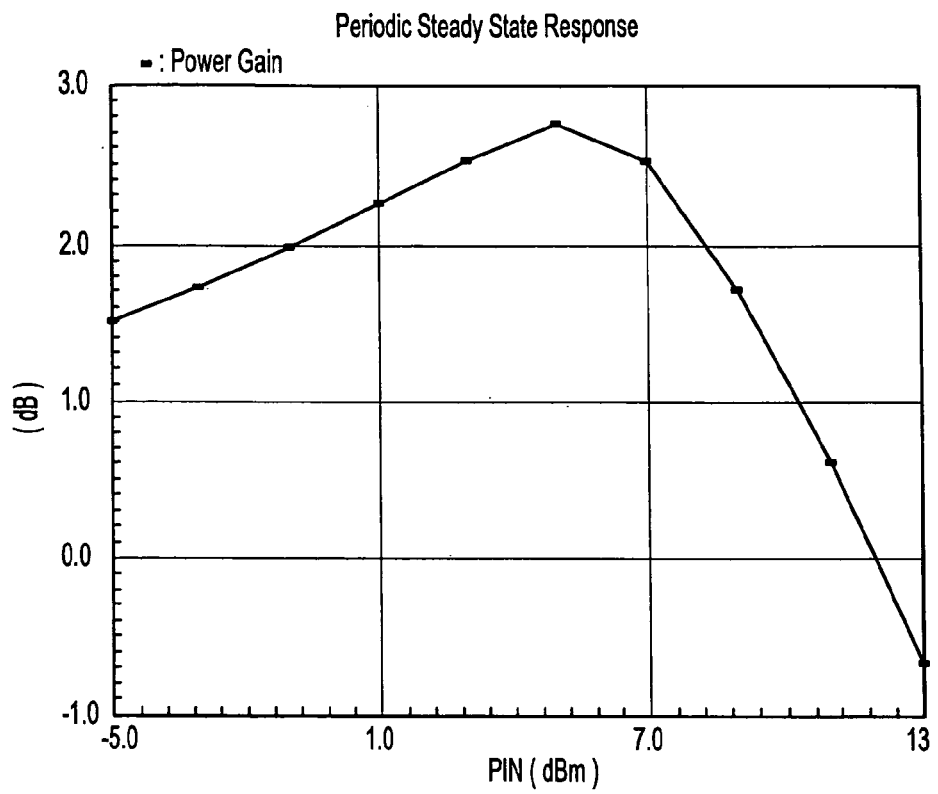
Figure 9D:
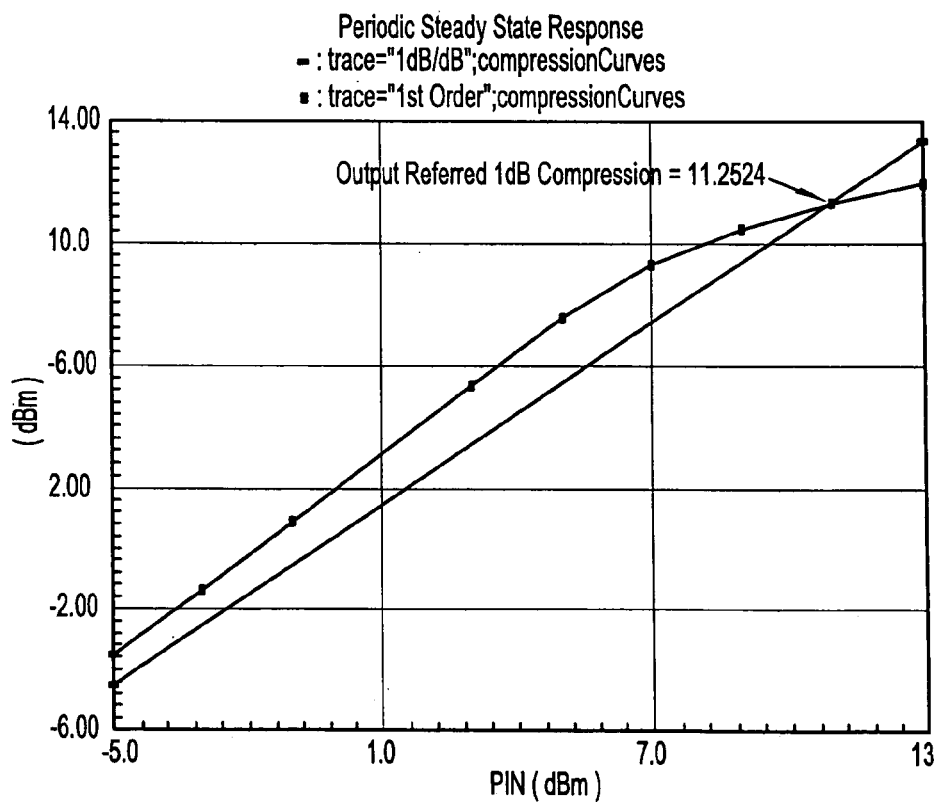

FIGS. 8A~8D are exemplary graphical illustrations of simulation results for the circuit in FIG. 7, wherein the input matching network is designed such that a low real impedance (about 7 Ohms to about 10 Ohms) is seen form the base toward the source (shown as $Z_S$ in FIG. 7). A peak PAE of 24% and a peak power gain of 5.7 dB are obtained with an input power of +5 dBm. Specifically, FIG. 8A graphically illustrates PAE versus source power level setting for $Z_S$ equal to 7 and 10 Ohms. FIG. 8B graphically illustrates collector efficiency versus source power level setting for $Z_S$ equal to 7 and 10 Ohms. FIG. 8C graphically illustrates power gain versus source power level setting for $Z_S$ equal to 7 and 10 Ohms. FIG. 8D graphically illustrates output power versus source power level setting for $Z_S$ equal to 7 and 10 Ohms. The straight line in FIG. 8D is the extrapolated small signal gain, where the simulated gains cross the straight line are the output-referred 1-dB compression points.

In another impedance matching technique, the input transmission line TL_IN (105) and open stub OS_IN (106) in FIG. 7 were sized to provide a conjugate match (and thus maximum power transfer) between the source and the base of the transistor T1. This impedance matching technique is commonly used for microwave Class E amplifier implementations and other millimeter wave power amplifiers classes.

FIGS. 9A~9D are exemplary graphical illustrations of simulation results for the circuit in FIG. 7, wherein the input matching network is designed to provide conjugate matching between the power source and the switch device (e.g., transistor base). A peak PAE of 14% and a peak power gain of 2.7 dB are obtained with an input power of +7 dBm. In particular, FIG. 9A graphically illustrates PAE versus source power level setting, FIG. 9B graphically illustrates collector efficiency versus source power level setting, FIG. 9C graphically illustrates power gain versus source power level setting, and FIG. 9D graphically illustrates output power versus source power level setting.

By comparing the simulation results in FIGS. 8A~8D and 9A~9D, it can be seen that in accordance with exemplary embodiments of the invention, improved performance is obtained when the input matching circuit is designed to provide a low real impedance of about 7 Ohms to about 10 Ohms, as compared to a conjugate match. These simulation results demonstrate that a more efficient class E operation can be obtained with the exemplary power amplifiers of FIGS. 1 and 7, for example, when the base of the bipolar switching transistor T1 is driven by a passive impedance transformer network that provide a low real impedance. In other words, in accordance with an exemplary embodiment of the invention, an input network (which is implemented with an input transmission line and open stub) for a class E amplifier circuit is preferably designed to provide low real impedance as seen from the base towards the source, which is in contrast to conventional methods wherein the input network is designed to provide optimum power transfer. In an exemplary embodiment of the invention, an input network acts as an impedance transformer from 50 Ohms (107) to about 7 to about 10 Ohms.

Figure 10A:
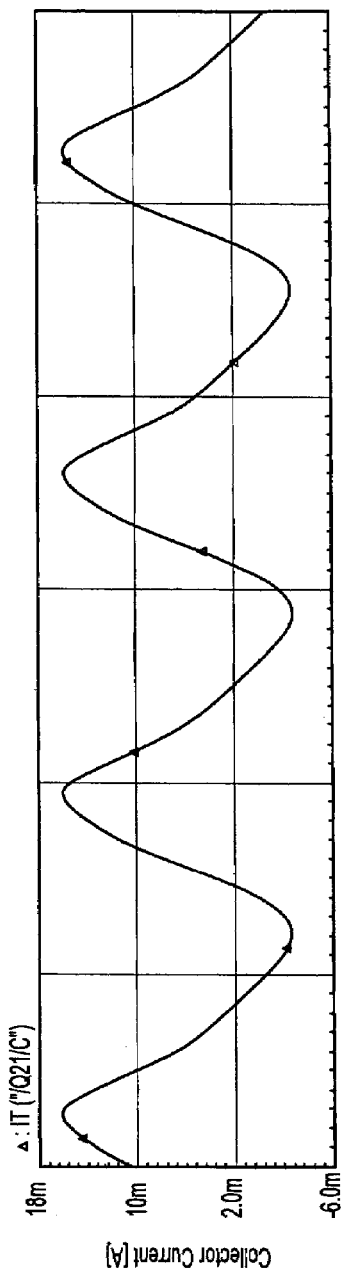
FIGS. 10A, 10B and 10C are exemplary graphical illustrations of collector current, collector voltage and load voltage waveforms, respectively, for the exemplary circuit of FIG. 7, when simulated with the input matching network designed to provide a real impedance of about 7 Ohms to about 10 Ohms.
Figure 10B:
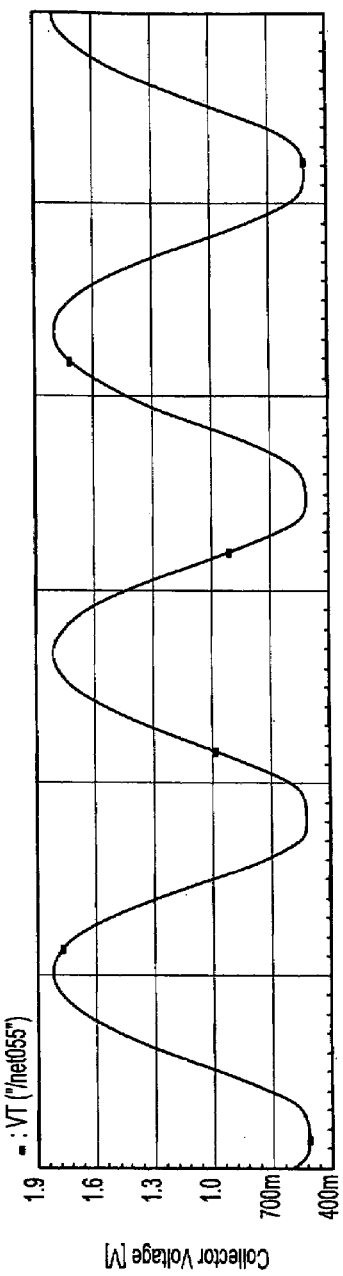
Figure 10C:
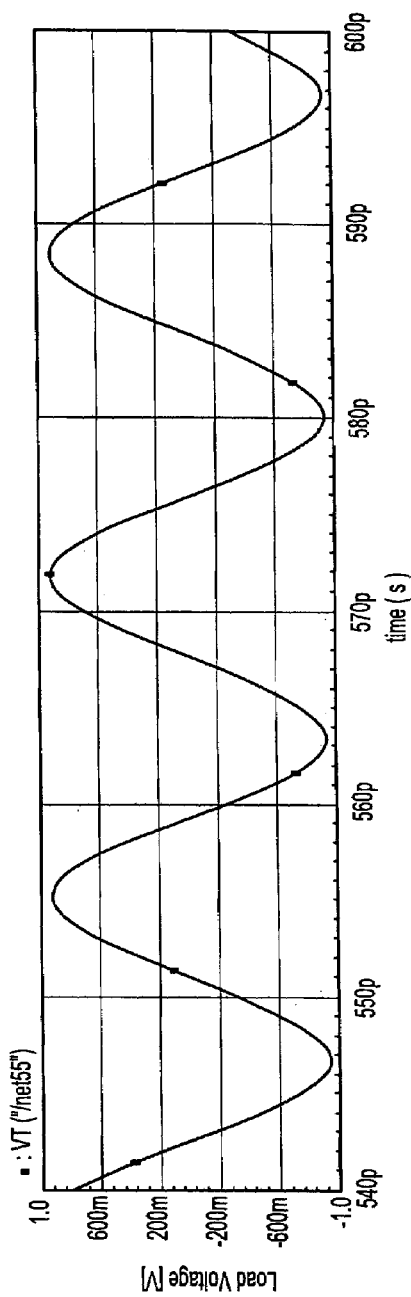

FIGS. 10A~10C and 11A~11B are diagrams that graphically illustrate other simulation results obtained for the exemplary Class E amplifier circuit (100) of FIG. 7 at 60 GHZ with the input matching circuit designed to provide a low real impedance of 7–10 Ohms. More specifically, FIGS. 10A, 10B and 10C illustrate waveforms of collector current, collector voltage and load voltage, respectively, for the exemplary Class E power amplifier circuit of FIG. 7. FIGS. 10A and 10B illustrate the desired non-overlapping characteristics for the collector voltage and current. Due to the high frequency of operation (60 GHz), $V_{sat}$ does not fall below about 500 mV while still maintaining a sufficiently fast turn-off time.

Figures 11A, 11B:
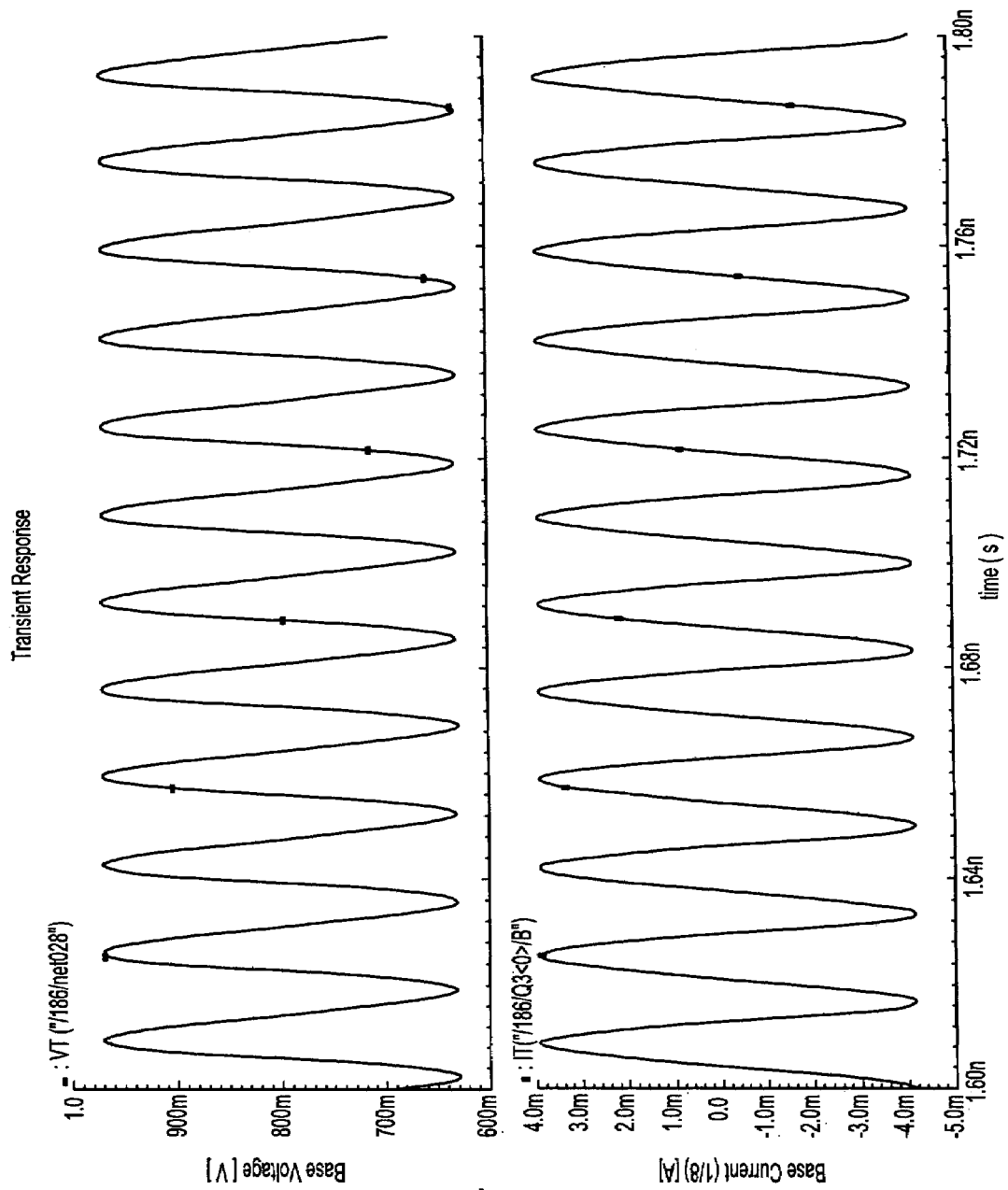
FIGS. 11A and 11B are exemplary graphical illustrations of base voltage and base current waveforms, respectively, for the exemplary circuit of FIG. 7, when simulated with the input matching network designed to provide a real impedance of 7 Ohms to about 10 Ohms.

Further, FIGS. 11A and 11B illustrate waveforms of the base voltage and base current for the switching transistor T1, respectively, for the exemplary Class E power amplifier circuit (100) of FIG. 7. It is to be noted that the base current for the exemplary optimum drive condition is actually asymmetrical, with the negative current peaks at 4.3 mA and the positive current peaks at 3.9 mA. This asymmetry is due to the necessity of removing excess minority carrier charge from the base in order to turn off the transistor T1. The base voltage swing is shown to be about 340 mVpp.

Figure 12:
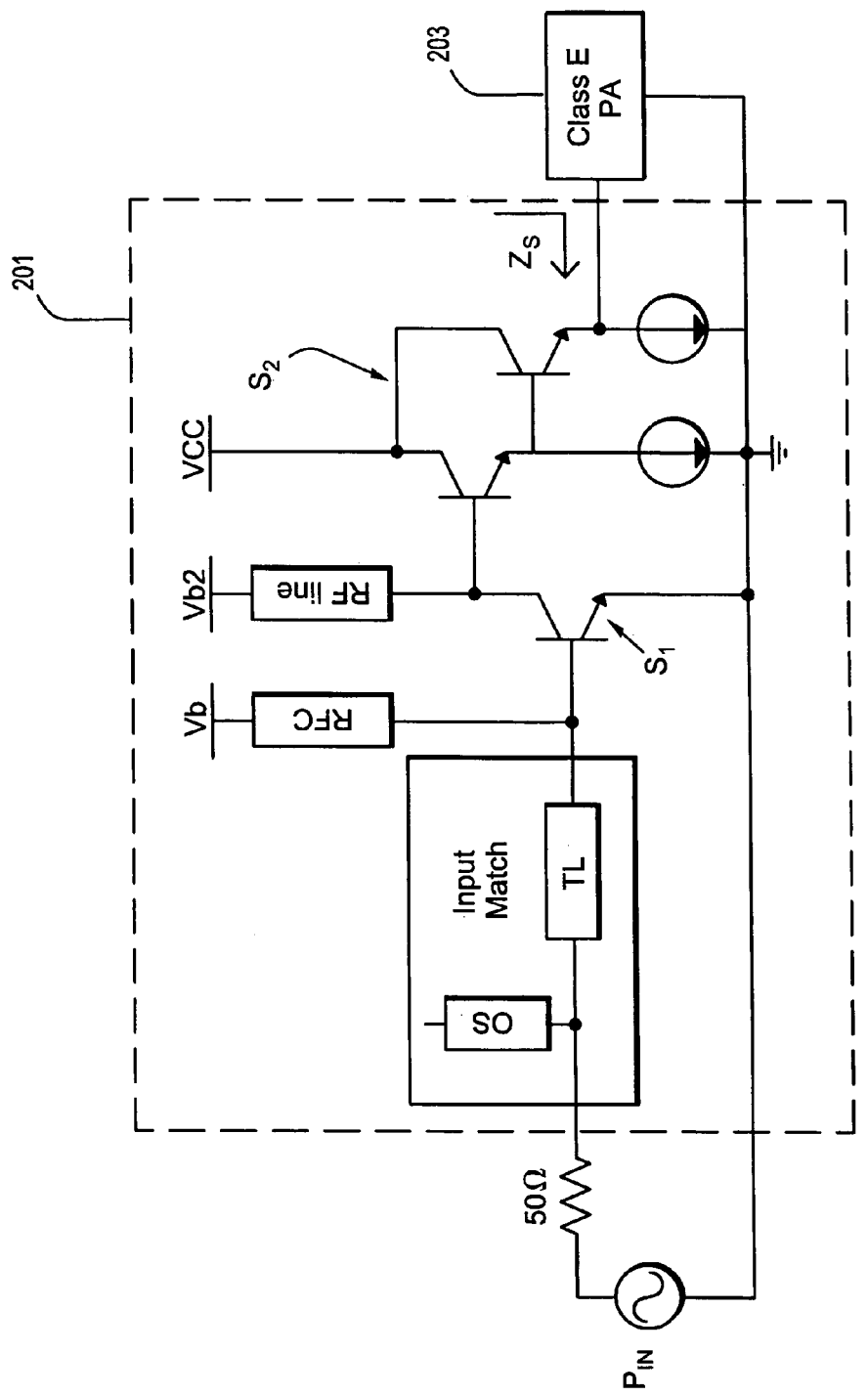
FIG. 12 is a schematic circuit diagram of a conventional driver circuit for a class E power amplifier.

In other exemplary embodiments of the invention, the input network to a Class E power amplifier can be implemented using an active driver stage or preamplifier to provide increased power gain of 10 dB, for example. FIG. 12 is a schematic circuit diagram of a conventional amplifier (200) that implements an active driver stage (201) for driving a class E power amplifier (202). The conventional driver circuit (201) comprises a common emitter stage (S1) followed by a double emitter follower (S2), which is typically used in high speed digital circuits operating up to 100 GHz. Due to its low output impedance, the circuit (201) of FIG. 12 was initially considered a good candidate for a preamplifier. Computer simulations performed for the exemplary circuit of FIG. 12.

The simulation results indicated that the use of the conventional driver (200) circuit did not yield the desired results. In particular, the simulation results demonstrated good voltage gain achieved (>10 dB). However, it was determined from the simulations that a difference in the large-signal output impedance while pushing and pulling current to and from the base of the power bipolar transistor T1 resulted in degradation of the efficiency and yielded an unstable behavior. The problem stems from the fact that the driver output impedance is low while pushing current to the base, but the driver output impedance is higher while pulling current from the base, which is exactly opposite the conditions that are needed to produce the preferred asymmetric base current waveform as shown in FIGS. 11A and 11B, for example. From these results, it was thus determined that an emitter follower driver stage with either a current source or resistor pull-down is a suboptimal for implementation as a Class E driver stage for millimeter wave frequencies.

Figure 13:
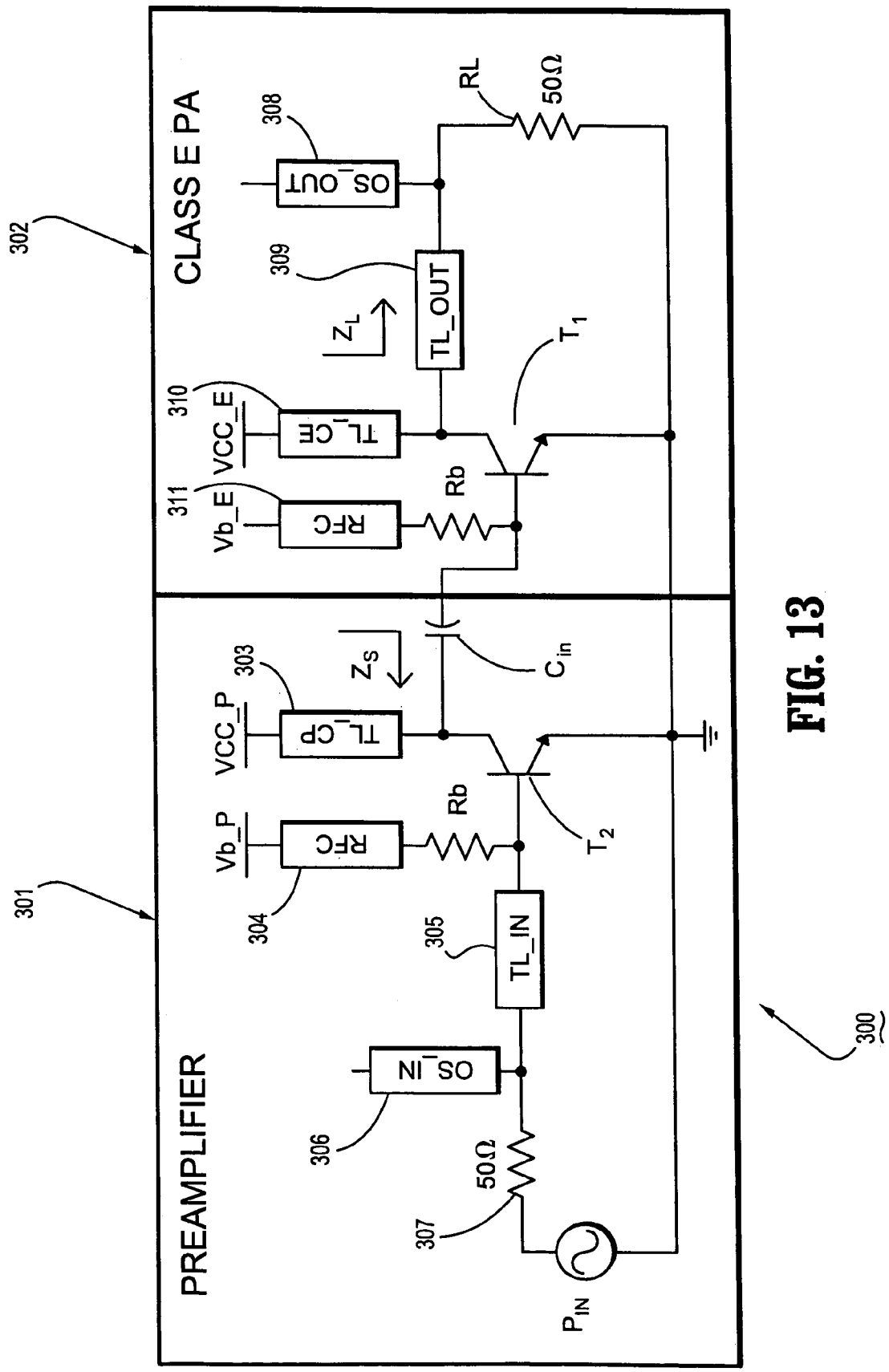
FIG. 13 is a schematic circuit diagram of a two-stage power amplifier circuit according to an exemplary embodiment of the invention.

FIG. 13 is a schematic circuit diagram illustrating a two-stage power amplifier circuit (300) according to an exemplary embodiment of the invention. In general, the exemplary two-stage power amplifier circuit (300) comprises a preamplifier circuit (301) coupled to a Class E power amplifier circuit (302). In general, the preamplifier circuit (301) comprises a common-emitter driver framework comprising a common-emitter transistor T2, a load transmission line TL_CP (303), base bias choke (304) and resistor Rb, input transmission line TL_IN (305) and open stub OS_IN (306), which are connected to power source PIN via a 50 Ohm transmission line (307).

The exemplary preamplifier circuit (301) is designed in accordance with the exemplary optimum driving conditions for a class E power amplifier as discussed above. The load transmission line (303) for the common emitter stage is neither chosen to achieve an inter-stage match for optimum power transfer nor to form a high impedance resonant tank with the input capacitance of the power amplifier (denoted Cin) (this later option leads to a relatively high voltage gain). These two approaches, like the use of an emitter follower with either a current source or resistor pull-down, were found to yield inefficient operation (and sometimes even unstable) of the Class E power amplifier.

In accordance with an exemplary embodiment of the invention, the class E power amplifier (302) is driven by an asymmetric current swing (such as depicted in FIG. 11) without forcing a voltage swing larger than 400 mVpp. This can be obtained through a driver with a small output impedance and enough current capability. A common emitter amplifier can be represented by a transconductance with a parallel output impedance and has a Thevenin equivalent of a voltage amplifier with a series output impedance. In this implementation, the load TL_CP (303) is sized such that Zs is as close as possible to a low real impedance. For example, in one exemplary embodiment, the achieved Zs corresponds to 10 Ohms plus a series inductive component. Due to the parasitic capacitances at the collector of T2, if the TL_CP (303) is sized to achieve a Zs with a lower inductive component, a higher resistive component is obtained. It is to be noted that the output impedance of the preamplifier changes dynamically, so the output impedance given by an s-parameter analysis is best regarded as an approximation.

The resistors Rb are connected to the base nodes of transistors T1 and T2 to provide resistive loss in the bias network, which may otherwise show resonance at lower frequencies (about 10 GHz). In this way, unconditional stability (through an s-parameter characterization) is obtained.

Figure 14A:
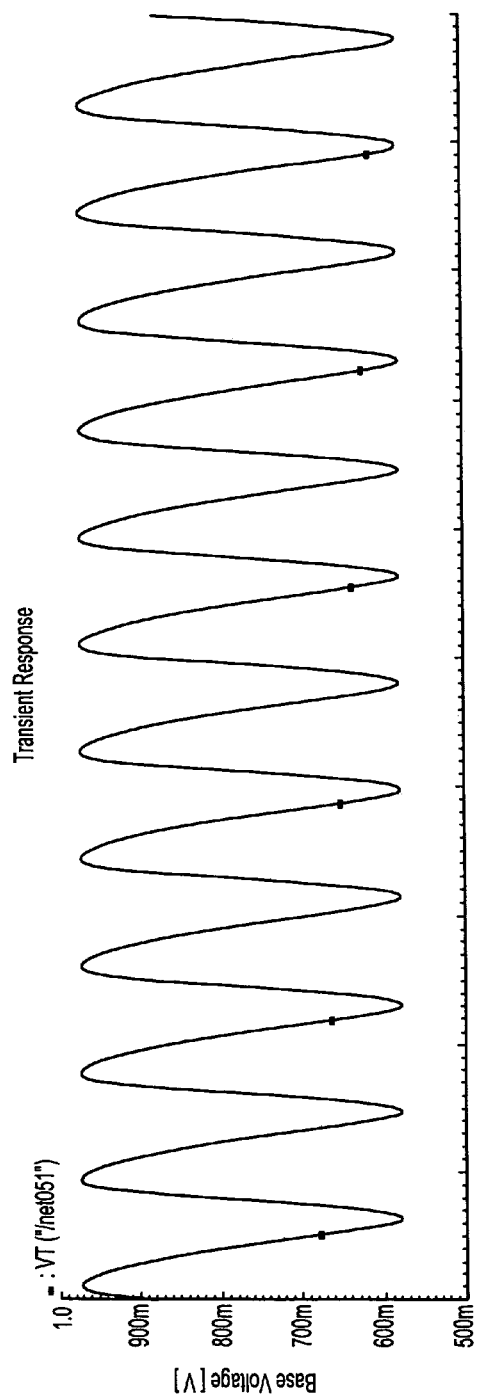
FIGS. 14A and 14B are exemplary graphical illustrations of base voltage and base current waveforms, respectively, for the exemplary class E switching transistor T1 in FIG. 13.
Figure 14B:
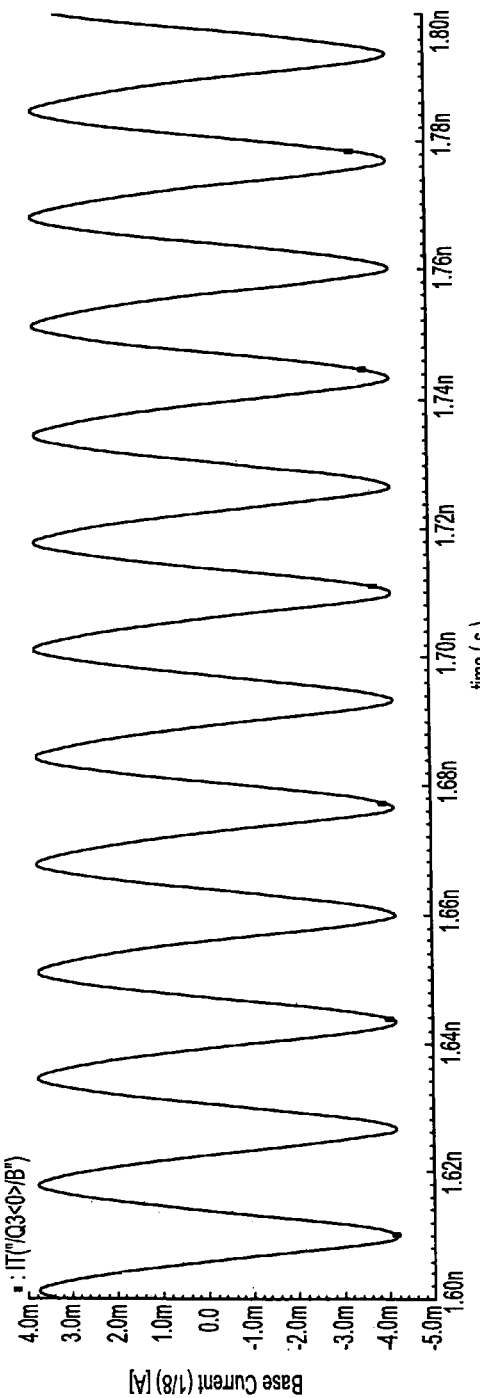
Figure 15A:
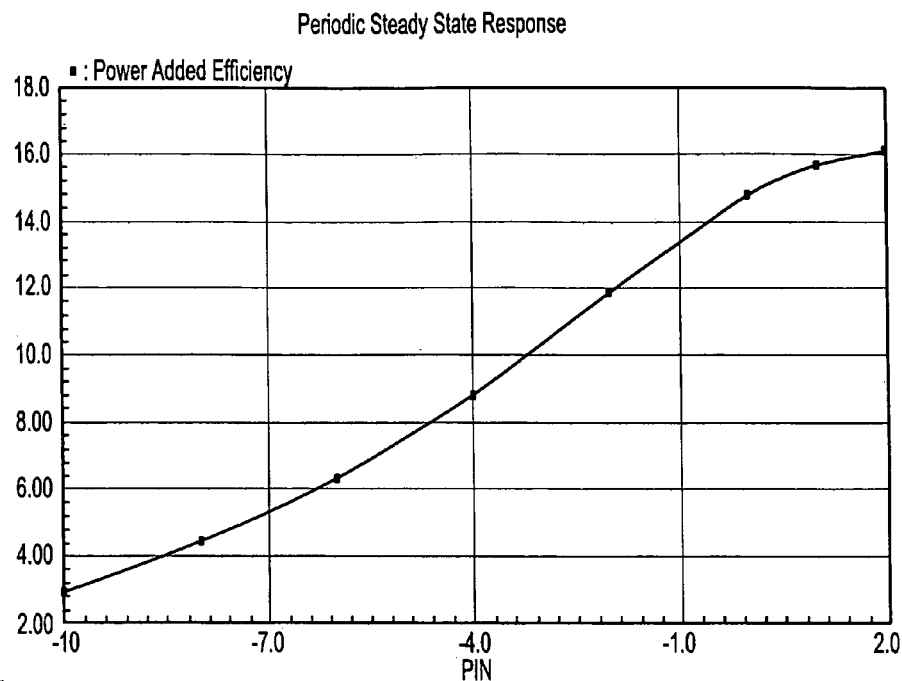
FIGS. 15A~15D are exemplary graphical diagrams of simulation results for the exemplary two-stage amplifier of FIG. 13.
Figure 15B:
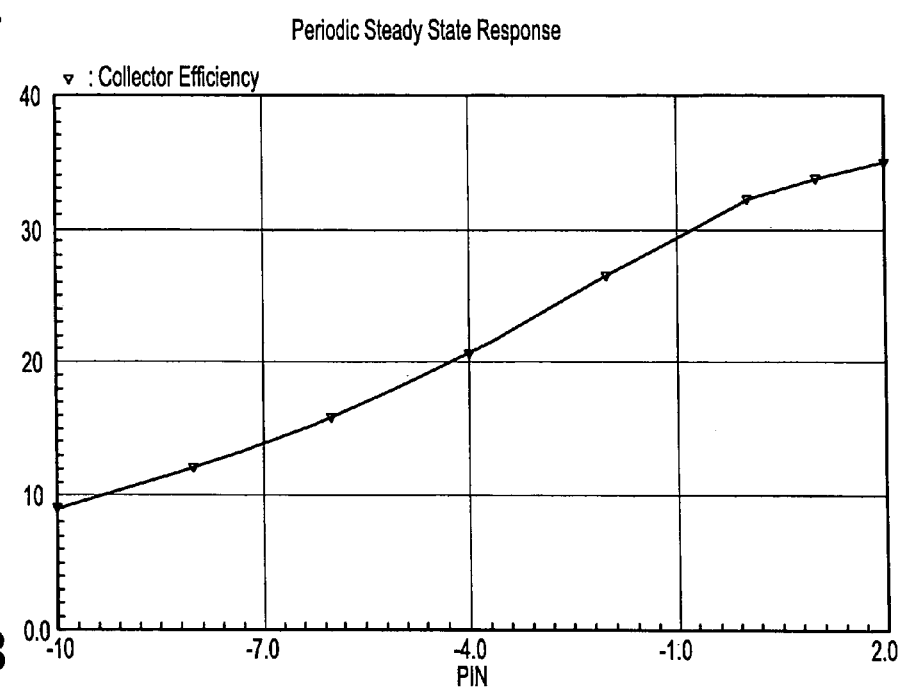
Figure 15C:
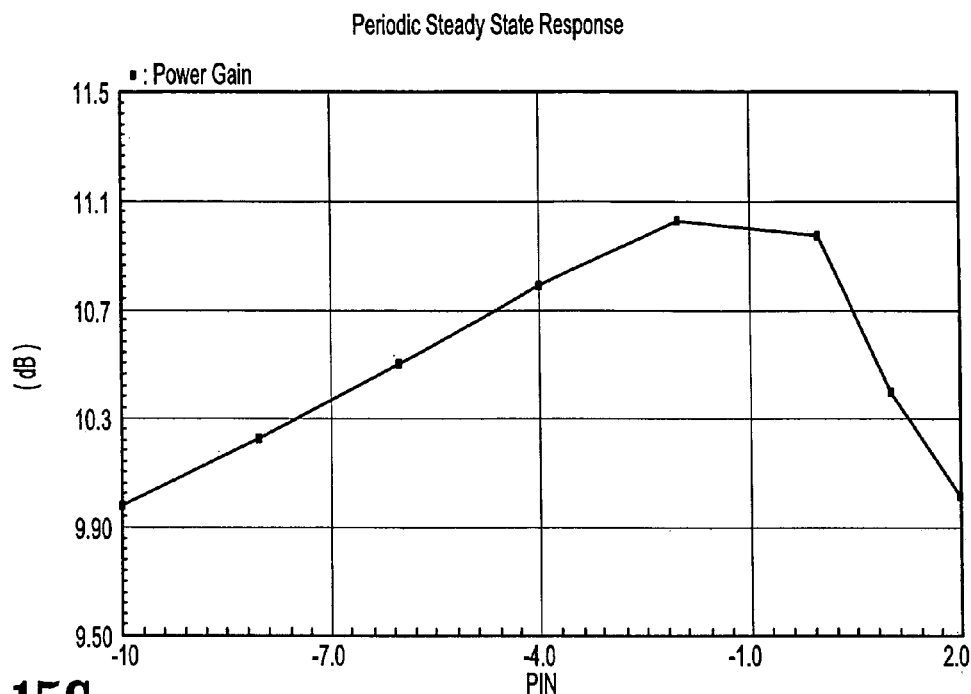
Figure 15D:
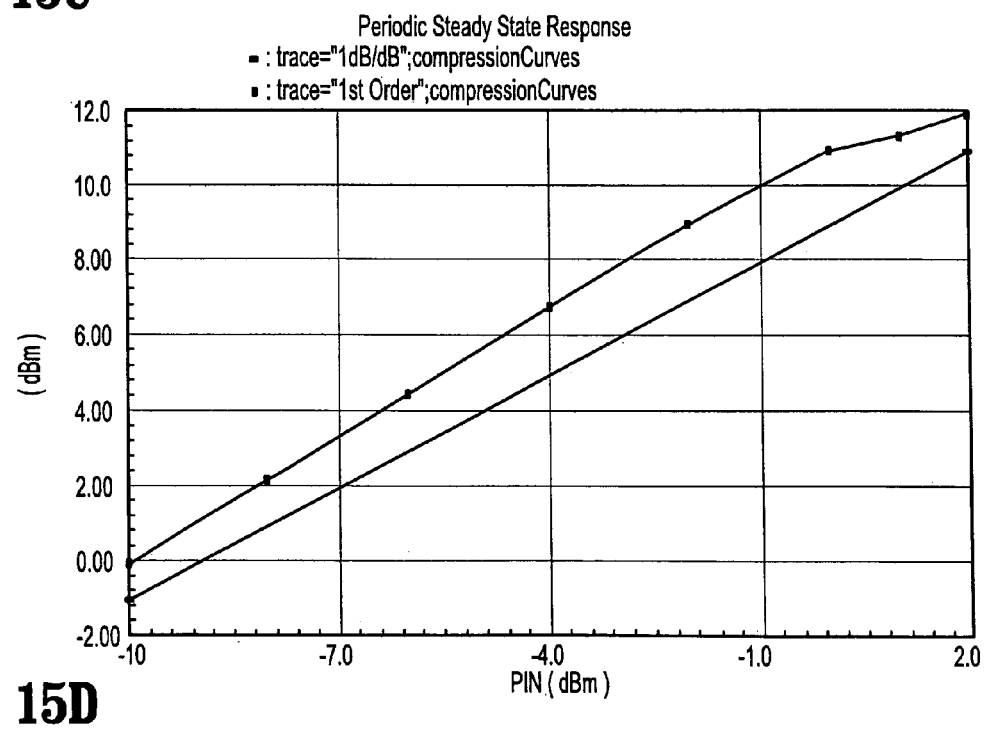

Computer simulations were performed for the exemplary two-stage power amplifier circuit (300) of FIG. 13. FIGS. 14A and 14B graphically illustrate simulated base voltage and base current waveforms for the switching transistor T1 in FIG. 13. It is to be noted that the base current waveform (FIG. 14B) for the switching transistor T1 is the same as the simulation results of the base current waveform (FIG. 11B) obtained in the design with a passive impedance transformation for the exemplary circuit of FIG. 7. A larger voltage swing is obtained when an active driver (preamplifier) is implemented due to the increased output impedance, as compared to the smaller output impedance obtained when a passive impedance transformer network is used (FIG. 7), but the voltage swing still is less than 400 mVpp, which is a desired optimal condition.

FIGS. 15A~15D are exemplary graphical diagrams of simulation results for the exemplary two-stage amplifier of FIG. 13. Specifically, FIG. 15A graphically illustrates PAE versus source power level setting, FIG. 15B graphically illustrates collector efficiency versus source power level setting, FIG. 15C graphically illustrates power gain versus source power level setting, and FIG. 15D graphically illustrates output power versus source power level setting. As depicted in the exemplary graphical diagrams of FIGS. 15A~15D, the exemplary design achieves a PAE of 16% for +2 dBm input power, and achieves a +10 dBm output power with 10 dB power gain and a PAE>15% at 60 GHz.

The simulation results for both the passive and active (preamp) circuits (FIGS. 7 and 13, respectively) indicate that the greatest efficiency is obtained under similar current and voltage transient waveforms (as gleaned from FIGS. 11A~11B and FIGS. 14A~14B, respectively).

Figure 16:
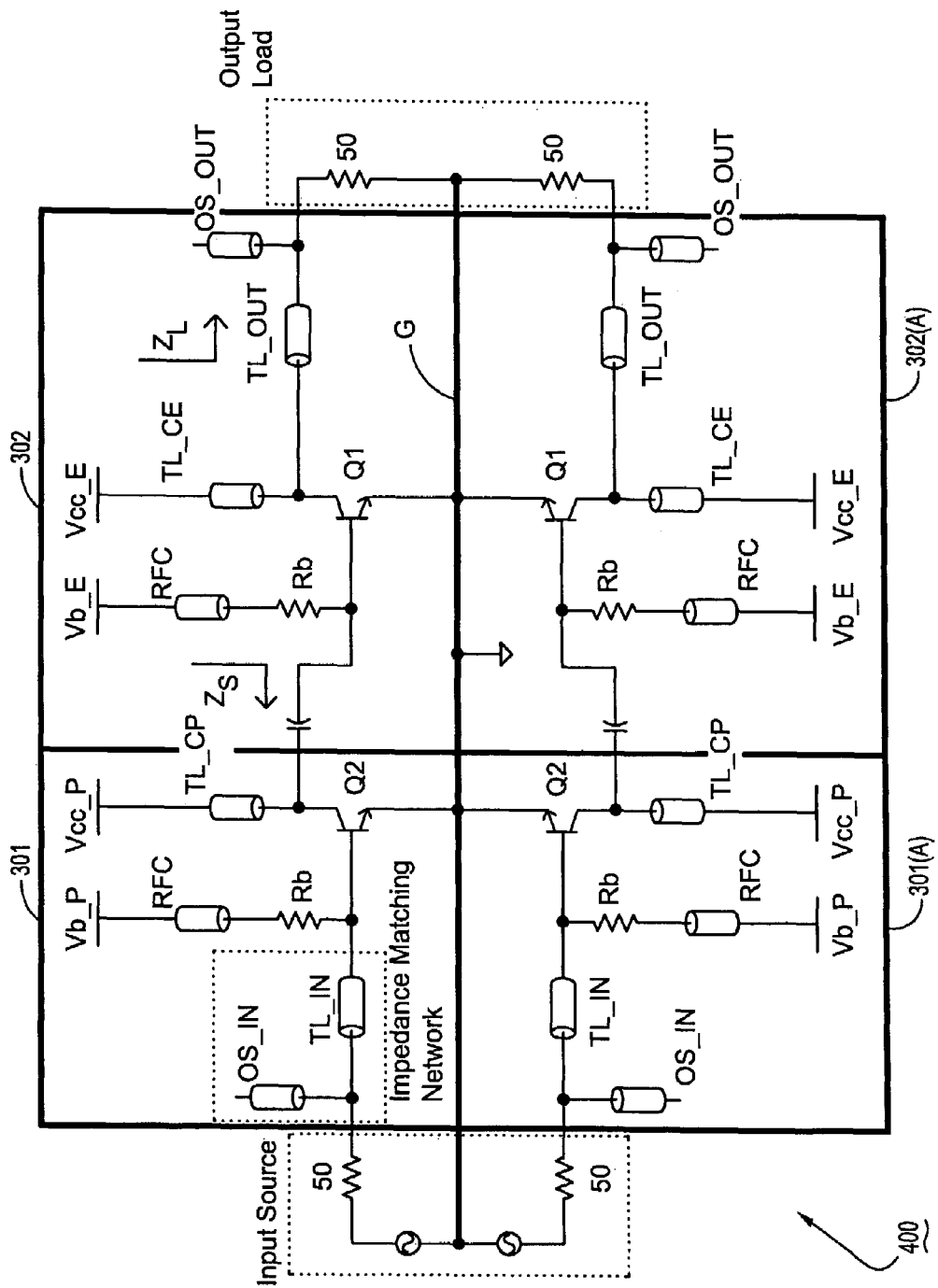
FIG. 16 is a schematic circuit diagram of a balanced differential switch-mode power amplifier circuit according to an exemplary embodiment of the invention.

In another exemplary embodiment of the invention, the exemplary two-stage amplifier circuit (300) can be extended for differential operation and higher power output. FIG. 16 is a schematic circuit diagram of a balanced differential switch-mode power amplifier circuit according to an exemplary embodiment of the invention. In particular, FIG. 16 schematically illustrates a differential amplifier circuit (400) comprising a first driver circuit (301) and class E power amplifier circuit (302) (having an architecture as depicted in FIG. 13), and a second driver circuit (301A) and class E power amplifier circuit (302A), which are mirror images of the respective driver circuit (301) and class E amplifier circuit (302) with respect to the ground line G, as shown in FIG. 16. In other words, the exemplary circuit of FIG. 13 is duplicated and driven from a differential source (in this case, 100-Ω differential) and supplies power to a differential load. The ground connections to the differential input source and differential load could optionally be omitted. The exemplary design provides 3 dB more output power, but the operation is otherwise substantially identical to the circuit in FIG. 13.

Figure 17:
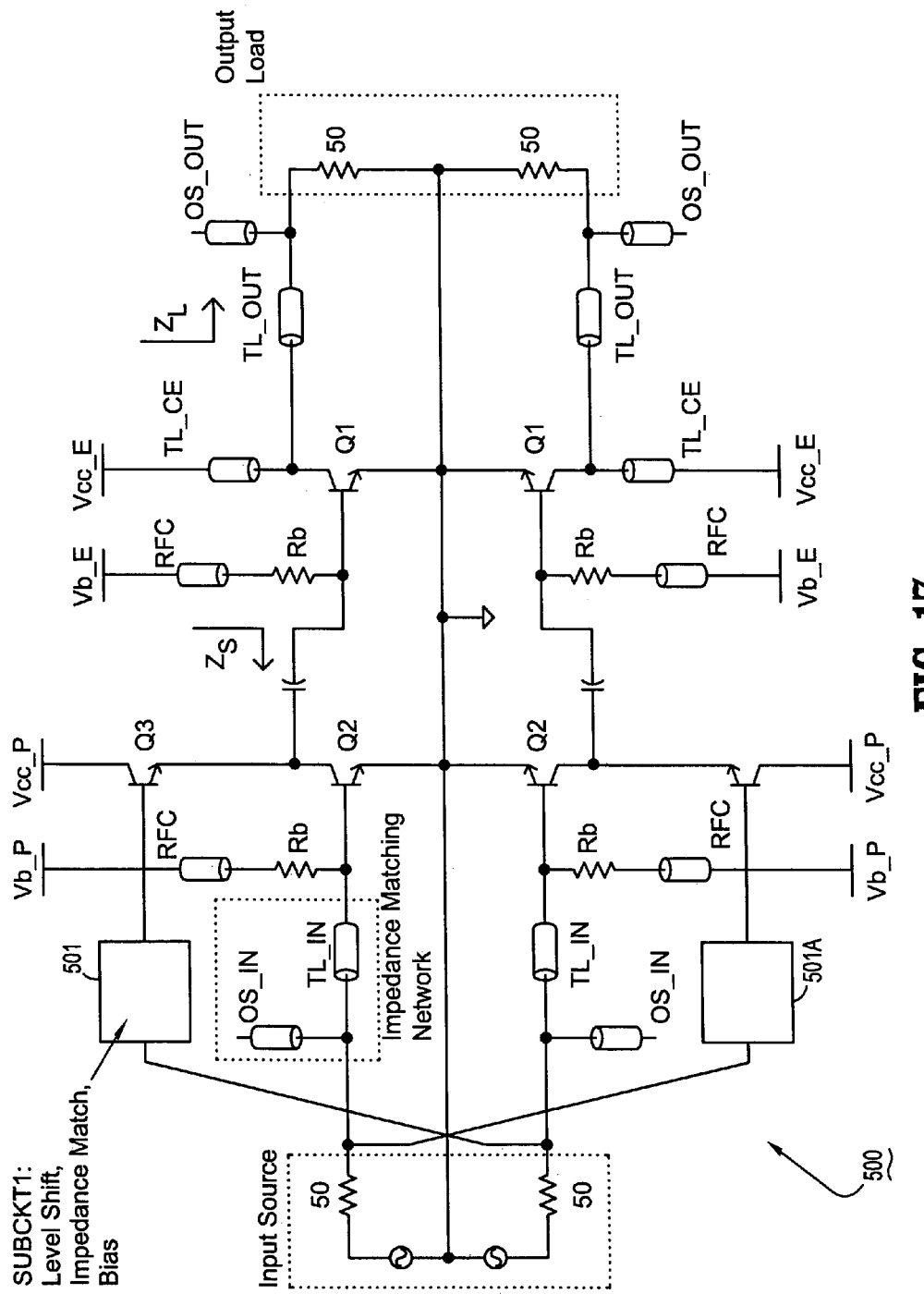
FIG. 17 is a schematic circuit diagram of a balanced differential switch-mode power amplifier circuit according to another exemplary embodiment of the invention.

FIG. 17 is a schematic circuit diagram of a balanced differential power amplifier (500) according to yet another exemplary embodiment of the invention. The differential amplifier circuit (500) is similar to the exemplary differential power amplifier circuit (400) of FIG. 16, except that the driver circuits include totem pole driver stages to supply drive current to the bipolar switching transistors, enabling higher power output.

More specifically, as depicted in FIG. 17, the load transmission lines TL_CP of driver circuits (301) and (301A) are replaced with bipolar transistors T3, which are driven out-of-phase with the respective transistors T2, providing both an active pull-up and pull-down. The transistors T3 are driven by circuits (501) and (501A), which provides biasing for Q3, optional DC level shifting, and optional impedance matching. Each transistor pair T2 and T3 can be biased at different DC quiescent currents by use of optional biasing RF chokes or constant current sources (not shown in FIG. 17). Thus, the pull-up and pull-down currents and impedances supplied to the base of switching transistors T1 can be set independently. Furthermore, the gain in the signal paths through T2 and T3 can be set independently by adjustments made in the impedance matching circuits for T2 (OS_IN and TL_IN) and T3 (SUBCKT1).

Accordingly, the exemplary circuit of FIG. 17 can be designed to drive the bases of transistors T1 using optimal driving conditions, e.g., an asymmetrical base current for transistors T1 as shown in FIGS. 11 and 15, a base voltage swing for transistors T1 which does not exceed 400 mVpp, and a low source impedance Zs seen from the bases of transistors T1 which yields the optimal base voltage swing.

Other exemplary designs include extensions to the circuits of FIG. 17, which can be readily envisioned by one of ordinary skill in the art. For instance, the totem pole driver transistors T2 and T3 could be preceded by other differential circuits which provide appropriate drive signals to T2 and T3 (e.g., differential amplifier pair of transistors or a transformer) without changing the basic functionality.

Although exemplary embodiments have been described herein with reference to the accompanying drawings, it is to be understood that the present invention is not limited to those exemplary embodiments, and that various other changes and modifications may be affected therein by one skilled in the art without departing from the scope or spirit of the invention. All such changes and modifications are intended to be included within the scope of the invention as defined by the appended claims.

We claim:

1. A power amplifier circuit, comprising:
an active switch device comprising a BJT (bipolar junction transistor); and
an input network coupled to a base of the BJT to drive the active switch for a switch-mode operation,
wherein the input network provides a source impedance Zs as seen from the base of the BJT which yields an asymmetrical base current and a base voltage having a swing that does not exceed about 400 mVpp (millivolts peak-to-peak).

2. The power amplifier circuit of claim 1, wherein the asymmetrical base current has a negative peak voltage amplitude that is greater than a positive peak voltage amplitude.

3. The power amplifier circuit of claim 1, wherein the source impedance Zs is about 7 Ohms to about 15 Ohms.

4. The power amplifier circuit of claim 1, wherein the power amplifier circuit is implemented using a silicon germanium semiconductor fabrication process.

5. The power amplifier circuit of claim 1, wherein the power amplifier circuit is a Class E power amplifier.

6. The power amplifier circuit of claim 1, wherein the input network comprises a passive impedance transformation network.

7. The power amplifier circuit of claim 6, wherein the passive impedance transformation network comprises integrated circuit transmission lines.

8. The power amplifier circuit of claim 6, wherein the power amplifier circuit is differential power amplifier circuit.

9. The power amplifier circuit of claim 1, wherein the input network comprises an active driver stage.

10. The power amplifier circuit of claim 9, wherein the active driver stage comprises a common-emitter preamplifier circuit.

11. The power amplifier circuit of claim 9, wherein the power amplifier circuit is a differential power amplifier.

12. The power amplifier circuit of claim 11, comprising a totem-pole circuit.

13. The power amplifier circuit of claim 1, wherein the power amplifier operates with a fundamental frequency of about 10 GHz or more.

14. The power amplifier circuit of claim 13, wherein the power amplifier circuit provides an output power of +10 dBm or greater with a power added efficiency of 15% or greater.

15. A method for amplifying a signal, comprising:
inputting an AC signal to a first stage of a power amplifier circuit; and
outputting an AC signal from the first stage to a second stage comprising a BJT (bipolar junction transistor) that is operated in a switch mode; and
driving the BJT using the AC signal output from the first stage, wherein driving comprises applying an asymmetrical base current to a base terminal of the BJT to provide a base voltage having a swing that does not exceed about 400 mVpp (millivolts peak-to-peak).

16. The method of claim 15, wherein the asymmetrical base current has a negative peak voltage amplitude that is greater than a positive peak voltage amplitude.

17. The method of claim 15, wherein driving comprises providing a source impedance Zs seen from the base of the BJT which yields the asymmetrical drive current and base voltage.

18. The method of claim 17, wherein the source impedance Zs is about 7 Ohms to about 15 Ohms.

19. The method of claim 15, comprising operating the BJT in a Class E mode of operation.

20. The method of claim 15, comprising amplifying the input AC signal in the first stage and outputting an amplified AC signal to the second stage.

21. The method of claim 15, further comprising filtering an AC signal generated at a collector node of the BJT and outputting the filtered signal from the second stage.

22. The method of claim 15, further comprising operating the BJT in a switch mode at a fundamental frequency of 10 GHz or greater.

23. The method of claim 22, further comprising outputting an amplified AC signal from the second stage having an output power of output power of +10 dBm.

24. The method of claim 15, wherein inputting an AC signal to a first stage comprises inputting AC signals to differential input terminals.

25. A power amplifier circuit, comprising:
a first stage comprising a common-emitter amplifier; and
a second stage coupled to an output of the first stage, the second stage comprising a BJT (bipolar junction transistor) that is operated in switch mode;
wherein the first stage outputs driving signals to the second stage to drive the BJT with an asymmetrical base current having a negative peak amplitude that is greater than a positive peak amplitude and base voltage having a voltage swing that does not exceed 400 mVpp.

26. The power amplifier circuit of claim 25, wherein the second stage has an output impedance Zs as seen from the base of the BJT on the order of about 7–15 Ω.

27. The power amplifier circuit of claim 25, wherein the first stage comprises an impedance transform network.

28. The power amplifier circuit of claim 25, wherein the power amplifier has a fundamental frequency of operation of 10 GHz or greater.

29. The method of claim 28, wherein the power amplifier circuit provides an output power of about +10 dBm or greater with a PAE of 15% or greater.

* * * * *